US012334336B2

(12) United States Patent
Hashimoto et al.

(10) Patent No.: US 12,334,336 B2
(45) Date of Patent: Jun. 17, 2025

(54) METHOD OF MANUFACTURING SEMICONDUCTOR DEVICE, SUBSTRATE PROCESSING METHOD, SUBSTRATE PROCESSING APPARATUS, AND RECORDING MEDIUM

(71) Applicant: KOKUSAI ELECTRIC CORPORATION, Tokyo (JP)

(72) Inventors: Yoshitomo Hashimoto, Toyama (JP); Katsuyoshi Harada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 509 days.

(21) Appl. No.: 17/574,245

(22) Filed: Jan. 12, 2022

(65) Prior Publication Data

US 2022/0230870 A1  Jul. 21, 2022

(30) Foreign Application Priority Data

Jan. 18, 2021 (JP) .................................. 2021-005886

(51) Int. Cl.
*H01L 21/02* (2006.01)
*C23C 16/455* (2006.01)
*C23C 16/52* (2006.01)

(52) U.S. Cl.
CPC .... *H01L 21/0228* (2013.01); *C23C 16/45544* (2013.01); *C23C 16/52* (2013.01)

(58) Field of Classification Search
CPC .......... H01L 21/0228; H01L 21/02304; H01L 21/02312; H01L 21/02123;
(Continued)

(56) References Cited

U.S. PATENT DOCUMENTS

2008/0169534 A1  7/2008  Dip et al.
2013/0130512 A1  5/2013  Kato et al.
(Continued)

FOREIGN PATENT DOCUMENTS

JP  2008-198996 A   8/2008
JP  2012-255203 A  12/2012
(Continued)

OTHER PUBLICATIONS

Taiwan Office Action issued on Sep. 29, 2022 for Taiwan Patent Application No. 110140070.
(Continued)

*Primary Examiner* — Evan G Clinton
(74) *Attorney, Agent, or Firm* — Volpe Koenig

(57) ABSTRACT

There is provided a technique that includes forming a film in a concave portion provided on a surface of a substrate by performing a cycle a predetermined number of times, the cycle including: (a) forming an adsorption inhibition layer by supplying an adsorption inhibitor, which inhibits adsorption of a precursor, to the substrate and adsorbing the adsorption inhibitor on adsorption sites of an upper portion in the concave portion; (b) forming a first layer by supplying the precursor to the substrate and adsorbing the precursor on adsorption sites existing in the concave portion in which the adsorption inhibition layer is formed; and (c) modifying the adsorption inhibition layer and the first layer into a second layer by supplying a first reactant, which chemically reacts with both the adsorption inhibition layer and the first layer, to the substrate.

20 Claims, 7 Drawing Sheets

(58) Field of Classification Search
CPC ........... H01L 21/02211; H01L 21/0217; H01L 21/28562; H01L 21/76843–76844; H01L 21/76877–76879; C23C 16/045; C23C 16/345; C23C 16/0272–029; C23C 16/08; C23C 16/12–14; C23C 16/52

See application file for complete search history.

(56) References Cited

U.S. PATENT DOCUMENTS

| | | |
|---|---|---|
| 2017/0314123 A1 | 11/2017 | Shimizu |
| 2018/0237912 A1 | 8/2018 | Takahashi et al. |
| 2019/0051512 A1 | 2/2019 | Kato et al. |
| 2019/0287787 A1 | 9/2019 | Nishino et al. |
| 2020/0032390 A1* | 1/2020 | Kato ................. H01L 21/67748 |
| 2020/0251326 A1 | 8/2020 | Kubo et al. |
| 2021/0087683 A1* | 3/2021 | Yeon ................. C23C 16/45544 |
| 2022/0119939 A1* | 4/2022 | Noh .................... H01L 21/0228 |

FOREIGN PATENT DOCUMENTS

| | | |
|---|---|---|
| JP | 2017-069407 A | 4/2017 |
| JP | 2017-201653 A | 11/2017 |
| JP | 2018-137369 A | 8/2018 |
| JP | 2019-165079 A | 9/2019 |
| JP | 2020-017708 A | 1/2020 |
| JP | 2020-126898 A | 8/2020 |
| KR | 10-2020-0096128 A | 8/2020 |
| TW | 201843328 A | 12/2018 |
| WO | 2020/118100 A1 | 6/2020 |

OTHER PUBLICATIONS

Korean Office Action issued on Mar. 27, 2024 for Korean Patent Application No. 10-2022-0000206.
Singapore Search Report issued on Apr. 24, 2023 for Singapore Patent Application No. 10202200100R.
Singapore Written Opinion issued on Apr. 24, 2023 for Singapore Patent Application No. 10202200100R.
Japanese Office Action issued on Sep. 13, 2022 for Japanese Patent Application No. 2021-005886.
Japanese Office Action issued on Jan. 17, 2023 for Japanese Patent Application No. 2021-005886.

* cited by examiner

FIG. 5G
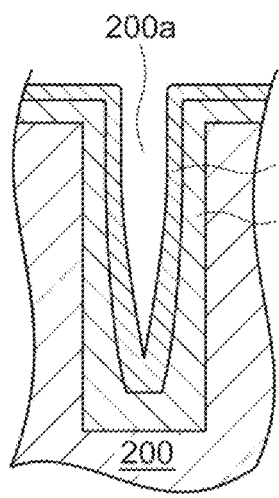
FIG. 5H
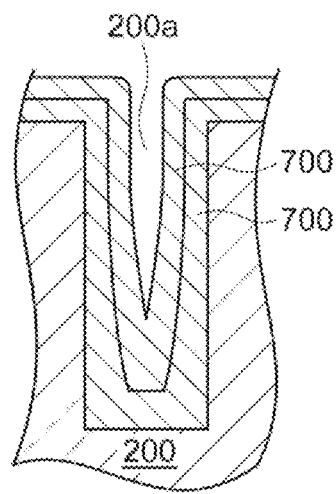
FIG. 5I
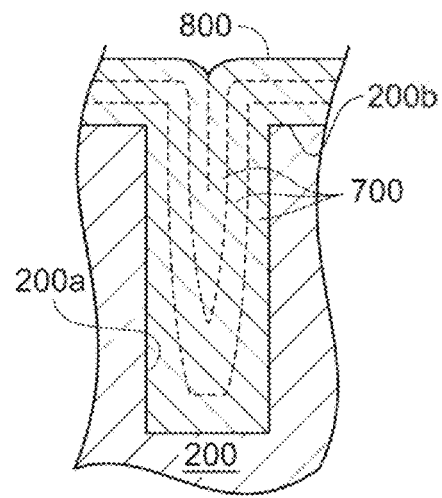
FIG. 6

US 12,334,336 B2

METHOD OF MANUFACTURING SEMICONDUCTOR DEVICE, SUBSTRATE PROCESSING METHOD, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2021-005886, filed on Jan. 18, 2021, the entire contents of which are incorporated herein by reference.

TECHNICAL FIELD

The present disclosure relates to a method of manufacturing semiconductor device, a substrate processing method, a substrate processing apparatus, and a recording medium.

BACKGROUND

As a process of manufacturing a semiconductor device, there may be a case of performing a process that forms a film in a concave portion such as a trench or the like provided on a surface of a substrate, by using a reaction inhibition gas.

SUMMARY

However, when the reaction inhibition gas is used, a film-forming reaction is partially inhibited. As a result, the total deposition rate is lowered, and the components contained in the reaction inhibition gas are introduced into the formed film, whereby the film quality may deteriorate.

Some embodiments of the present disclosure provide a technique capable of forming a high-quality film in a concave portion provided on a surface of a substrate at a high deposition rate.

According to embodiments of the present disclosure, there is provided a technique that includes forming a film in a concave portion provided on a surface of a substrate by performing a cycle a predetermined number of times, the cycle including: (a) forming an adsorption inhibition layer by supplying an adsorption inhibitor, which inhibits adsorption of a precursor, to the substrate and adsorbing the adsorption inhibitor on adsorption sites of an upper portion in the concave portion; (b) forming a first layer by supplying the precursor to the substrate and adsorbing the precursor on adsorption sites existing in the concave portion in which the adsorption inhibition layer is formed; and (c) modifying the adsorption inhibition layer and the first layer into a second layer by supplying a first reactant, which chemically reacts with both the adsorption inhibition layer and the first layer, to the substrate.

BRIEF DESCRIPTION OF DRAWINGS

The accompanying drawings, which are incorporated in and constitute a part of the specification, illustrate embodiments of the present disclosure.

FIG. 4A is a partially enlarged cross-sectional view of the surface of a wafer 200 after an adsorption inhibitor is adsorbed on adsorption sites of an upper portion in a concave portion 200a to form an adsorption inhibition layer 300. FIG. 4B is a partially enlarged cross-sectional view of the surface of the wafer 200 after a precursor is adsorbed on the adsorption sites existing in the concave portion 200a after formation of the adsorption inhibition layer 300 to form a first layer 400. FIG. 4C is a partially enlarged cross-sectional view of the surface of the wafer 200 after the adsorption inhibition layer 300 and the first layer 400 are modified into a second layer 500 by a first reactant. FIG. 4D is a partially enlarged cross-sectional view of the surface of the wafer 200 after, from the state of FIG. 4C, an adsorption inhibitor is adsorbed on the adsorption sites of the upper portion (i.e., the adsorption sites on the surface of the second layer 500) in the concave portion 200a having the second layer 500 on the surface thereof to form an adsorption inhibition layer 300 again. FIG. 4E is a partially enlarged cross-sectional view of the surface of the wafer 200 after a precursor is adsorbed on the adsorption sites (i.e., the adsorption sites on the surface of the second layer 500) existing in the concave portion 200a having the second layer 500 on the surface, on which the adsorption inhibition layer 300 is formed again, to form a first layer 400 again. FIG. 4F is a partially enlarged cross-sectional view of the surface of the wafer 200 after the adsorption inhibition layer 300 and the first layer 400 formed on the surface of the second layer 500 are modified into a second layer 500 by a first reactant. FIG. 4G is a partially enlarged cross-sectional view of the surface of the wafer 200 after, from the state of FIG. 4F, a cycle that includes non-simultaneously performing steps A to C is performed a predetermined number of times, a second layer 500 is further stacked in the concave portion 200a, and then the entirety of the concave portion 200a is filled with a film 600.

FIGS. 5A to 5I are partially enlarged cross-sectional views showing an example of a substance formed in each step of a processing sequence in a first modification of the present disclosure. FIGS. 5A to 5C are partially enlarged cross-sectional views similar to FIGS. 4A to 4C, respectively. FIG. 5D is a partially enlarged cross-sectional view of the surface of the wafer 200 after the second layer 500 has been modified into a third layer 700 by a second reactant. FIG. 5E is a partially enlarged cross-sectional view of the surface of the wafer 200 after, from the state of FIG. 5D, an adsorption inhibitor is adsorbed on the adsorption sites of the upper portion (i.e., the adsorption sites on the surface of the third layer 700) of the concave portion 200a having the third layer 700 on the surface thereof to form an adsorption inhibition layer 300 again. FIG. 5F is a partially enlarged cross-sectional view of the surface of the wafer 200 after a precursor is adsorbed on the adsorption sites (i.e., the adsorption sites on the surface of the third layer 700) existing in the concave portion 200a having the third layer 700 on the surface, on which the adsorption inhibition layer 300 is formed again, to form a first layer 400 again. FIG. 5G is a partially enlarged cross-sectional view of the surface of the wafer 200 after the adsorption inhibition layer 300 and the first layer 400 formed on the surface of the third layer 700 are modified into a second layer 500 by a first reactant. FIG. 5H is a partially enlarged cross-sectional view of the surface of the wafer 200 after the second layer 500 formed on the surface of the third layer 700 is modified into a third layer 700 by a second reactant. FIG. 5I is a partially enlarged cross-sectional view of the surface of the wafer 200 after, from the state of FIG. 5H, a cycle that includes non-simultaneously performing steps A to D non-simultaneously is performed a predetermined number of times and a third layer 700 is further stacked in the concave portion 200a, and after the entirety of the concave portion 200a is filled with a film 800.

FIG. 6 is a diagram showing cross-sectional SEM images of evaluation samples of Example 1 and Comparative Example 1 and calculation results of step coverage in the respective evaluation samples.

DETAILED DESCRIPTION

Figure 1:
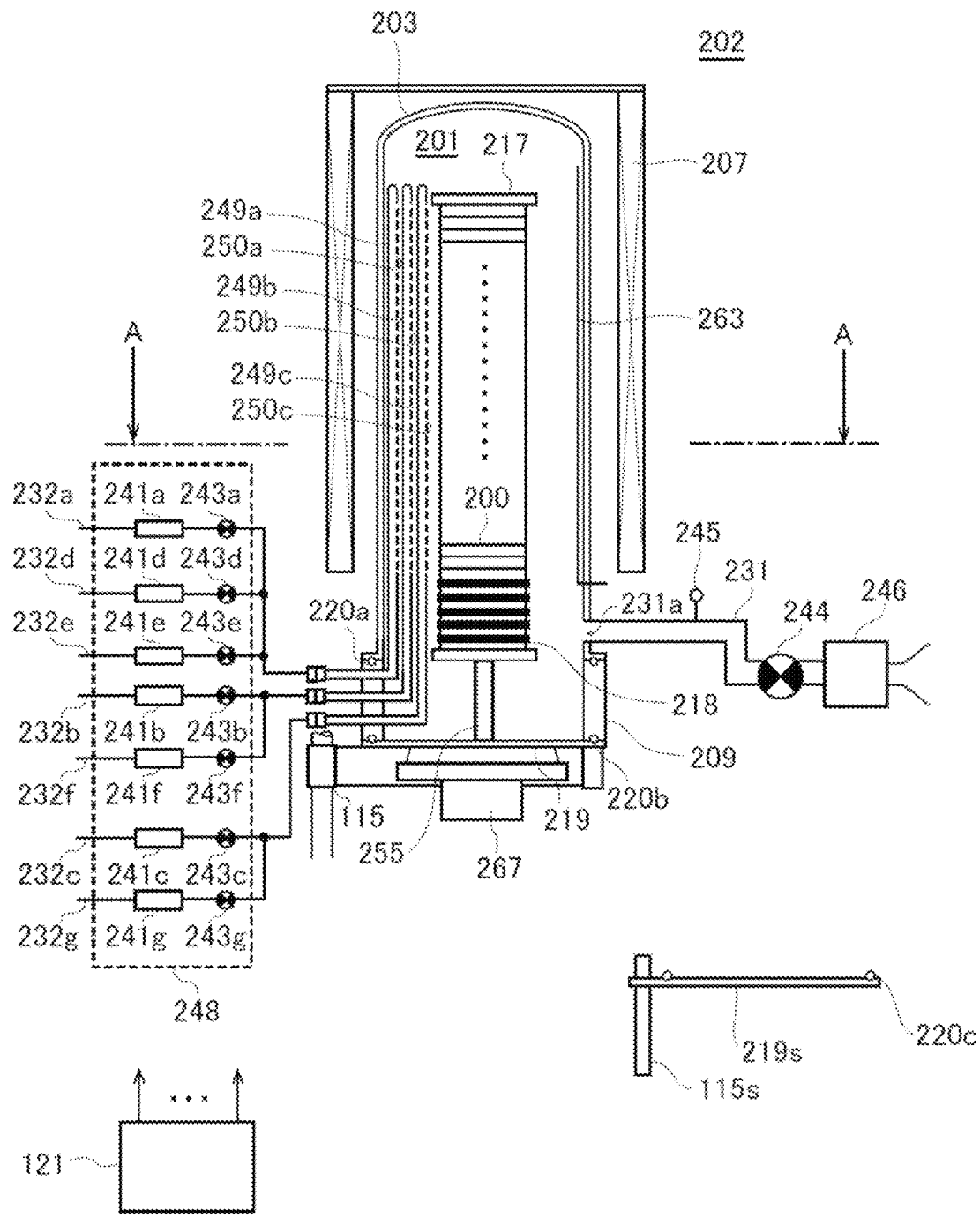
FIG. 1 is a schematic configuration diagram of a vertical process furnace of a substrate processing apparatus suitably used in embodiments of the present disclosure, in which the portion of the process furnace 202 is illustrated in a vertical sectional view.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In recent years, it has become difficult to control a shape of a film in a process of forming a film on a substrate due to a three-dimensional structure of a semiconductor device and miniaturization of patterns.

In a CVD (Chemical Vapor Deposition) method, which is generally known as a film-forming method, a deposition rate is not isotropic with respect to a three-dimensional substrate surface. When film formation is performed on the three-dimensional substrate surface, that is, a non-planar substrate surface, for example, a substrate surface on which a trench-shape pattern, a hole-shape pattern or both of them are formed, it may be difficult in the existing CVD method to control a film thickness inside a concave portion such as a trench or a hole. Particularly, there may be a case that, in the concave portion, a film thickness at a lower portion becomes thinner than a film thickness at an upper portion, so that a film thickness difference occurs (step coverage deteriorates). This is because it is difficult in the CVD method to uniformly supply vapor-phase-reacted molecules to various places in the concave portion. Further, it is known that the difference in film thickness between the lower portion and the upper portion in the concave portion becomes larger (the step coverage becomes worse) as an aspect ratio in the concave portion is larger. Furthermore, when the film formation at the upper portion of the concave portion proceeds at a faster rate than that at the lower portion and thus an opening of the concave portion is closed, the supply of vapor-phase-reacted molecules or a precursor gas may be hindered after being closed, so that a seam or a void may occur.

Besides the CVD method having these problems, there is also an ALD (Atomic Layer Deposition) method that can obtain an isotropic deposition rate with respect to a three-dimensional substrate surface. However, the ALD method still has a problem in that an opening of the concave portion is closed in film formation on a substrate surface having a concave portion such as a trench or a hole having a reverse taper shape. As a result, even when film formation is performed using the ALD method, a seam or a void extending in a depth direction (e.g., a vertical direction) of the concave portion may be generated at a central portion of a film formed in the concave portion.

When the seam or the void is generated in a film formed in the concave portion, a chemical solution may pass through the seam or the void generated in the film and permeate into the concave portion in a wet etching process after the film formation, thereby adversely affecting a base.

With respect to the above-mentioned problems, there is known a method of forming a film by supplying a reaction inhibition gas to an upper portion of a trench to lower a deposition rate at the upper portion of the trench. However, when the reaction inhibition gas is used, a film-forming reaction may be partially inhibited. As a result, the total deposition rate may be lowered, and components contained in the reaction inhibition gas are introduced into the film to be formed, whereby film quality may deteriorate.

On the other hand, the present inventors have found that it is possible to form a seamless and void-free high-quality film in a concave portion at a high deposition rate by forming a film in a concave portion by performing a cycle a predetermined number of times, the cycle including non-simultaneously performing: (a) forming an adsorption inhibition layer by supplying an adsorption inhibitor, which inhibits adsorption of a precursor, to a substrate with a concave portion provided on a surface of the substrate and adsorbing the adsorption inhibitor on adsorption sites of an upper portion in the concave portion; (b) forming a first layer by supplying the precursor to the substrate and adsorbing the precursor on adsorption sites existing in the concave portion in which the adsorption inhibition layer is formed; and (c) modifying the adsorption inhibition layer and the first layer into a second layer by supplying a first reactant, which chemically reacts with both the adsorption inhibition layer and the first layer, to the substrate. The present disclosure is based on the above finding found by the present inventors.

EMBODIMENTS OF THE PRESENT DISCLOSURE

Hereinafter, one aspect of the present disclosure will be described mainly with reference to FIGS. 1 to 3 and FIGS. 4A to 4G.

The drawings used in the following description are all schematic. The dimensional relationship of each element on the drawings, the ratio of each element, and the like do not always match the actual ones. Further, even between the drawings, the dimensional relationship of each element, the ratio of each element, and the like do not always match.

(1) Configuration of Substrate Processing Apparatus

As shown in FIG. 1, a process furnace 202 includes a heater 207 as a temperature adjuster (temperature adjustment part). The heater 207 has a cylindrical shape and is vertically installed by being supported by a holding plate. The heater 207 also functions as an activator (excitation part) that activates (excites) a gas with heat.

Inside the heater 207, a reaction tube 203 is arranged concentrically with the heater 207. The reaction tube 203 is made of a heat-resistant material such as, for example, quartz ($SiO_2$) or silicon carbide (SiC) and is formed in a cylindrical shape with an upper end thereof closed and a lower end thereof opened. Below the reaction tube 203, a manifold 209 is arranged concentrically with the reaction tube 203. The manifold 209 is made of a metallic material such as stainless steel (SUS) or the like and is formed in a cylindrical shape with upper and lower ends thereof opened. The upper end of the manifold 209 is engaged with the lower end of the reaction tube 203 and is configured to support the reaction tube 203. An O-ring 220a as a seal member is provided between the manifold 209 and the reaction tube 203. The reaction tube 203 is vertically installed similar to the heater 207. A process container (reaction container) is mainly composed of the reaction tube 203 and the manifold 209. A process chamber 201 is formed in a hollow portion of the process container. The process chamber 201 is configured to be capable of accommodating wafers 200 as substrates. The wafers 200 are processed in the process chamber 201.

Nozzles 249a to 249c as first to third suppliers are installed in the process chamber 201 so as to penetrate the side wall of the manifold 209. The nozzles 249a to 249c are also referred to as first to third nozzles, respectively. The nozzles 249a to 249c are made of, for example, a heat-resistant material such as quartz or SiC. Gas supply pipes 232a to 232c are connected to the nozzles 249a to 249c, respectively. The nozzles 249a to 249c are different nozzles, and the nozzles 249a and 249c are provided adjacent to the nozzle 249b.

At the gas supply pipes 232a to 232c, mass flow controllers (MFCs) 241a to 241c, which are flow rate controllers (flow control parts), and valves 243a to 243c, which are on-off valves, are installed, respectively, sequentially from the upstream side of a gas flow. Gas supply pipes 232d and 232e are respectively connected to the gas supply pipe 232a on the downstream side of the valve 243a. Gas supply pipes 232f and 232g are respectively connected to the gas supply pipes 232b and 232c at the downstream side of the valves 243b and 243c. On the gas supply pipes 232d to 232g, MFCs 241d to 241g and valves 243d to 243g are installed, respectively, sequentially from the upstream side of a gas flow. The gas supply pipes 232a to 232g are made of a metal material such as, for example, stainless steel or the like.

Figure 2:
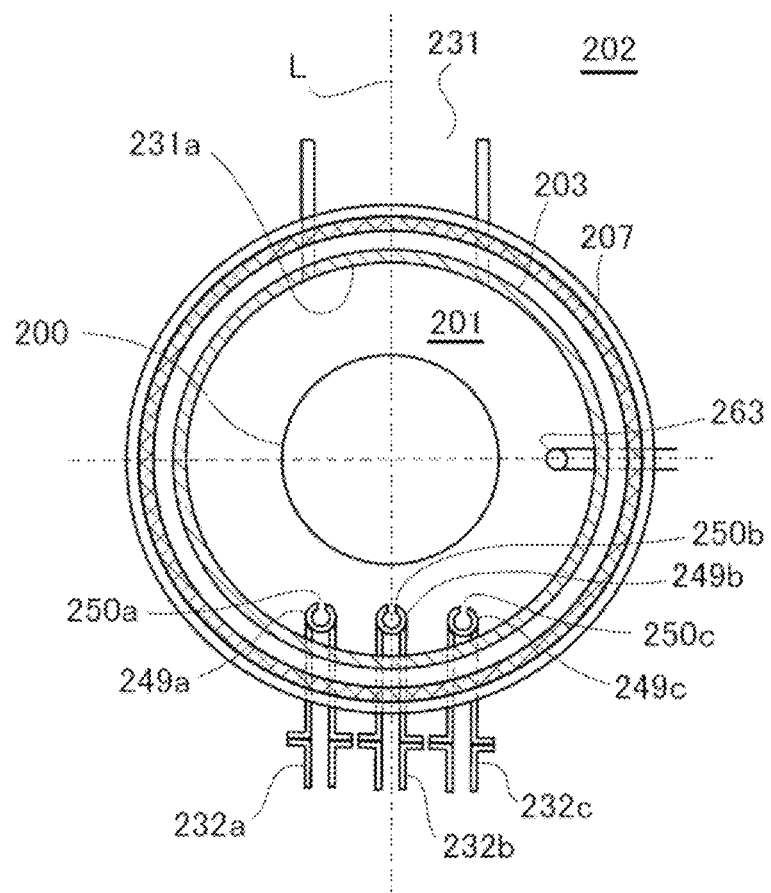
FIG. 2 is a schematic configuration diagram of the vertical process furnace of the substrate processing apparatus suitably used in embodiments of the present disclosure, in which the portion of the process furnace 202 is illustrated in a sectional view taken along line A-A in FIG. 1.

As shown in FIG. 2, the nozzles 249a to 249c are arranged in a space having an annular shape in a plane view between the inner wall of the reaction tube 203 and the wafers 200 so as to extend upward in the arrangement direction of the wafers 200 from the lower portion to the upper portion of the inner wall of the reaction tube 203. In other words, the nozzles 249a to 249c are respectively installed in a region horizontally surrounding a wafer arrangement region, in which the wafers 200 are arranged, on the lateral side of the wafer arrangement region so as to extend along the wafer arrangement region. In a plan view, the nozzle 249b is arranged so as to face the below-described exhaust port 231a on a straight line across the centers of the wafers 200 loaded into the process chamber 201. The nozzles 249a and 249c are arranged so as to sandwich a straight line L passing through the nozzle 249b and the center of the exhaust port 231a from both sides along the inner wall of the reaction tube 203 (the outer peripheral portions of the wafers 200). The straight line L is also a straight line passing through the nozzle 249b and the center of the wafers 200. That is, it can be said that the nozzle 249c is installed on the side opposite to the nozzle 249a with the straight line L interposed therebetween. The nozzles 249a and 249c are arranged line-symmetrically with the straight line L as an axis of symmetry. Gas supply holes 250a to 250c for supplying gases are formed on the side surfaces of the nozzles 249a to 249c, respectively. The gas supply holes 250a to 250c are respectively opened so as to face the exhaust port 231a in a plan view and can supply gases toward the wafers 200. The gas supply holes 250a to 250c are formed from the lower portion to the upper portion of the reaction tube 203.

From the gas supply pipe 232a, an adsorption inhibitor is supplied into the process chamber 201 via the MFC 241a, the valve 243a, and the nozzle 249a.

From the gas supply pipe 232b, a first reactant is supplied into the process chamber 201 via the MFC 241b, the valve 243b and the nozzle 249b.

From the gas supply pipe 232c, a second reactant is supplied into the process chamber 201 via the MFC 241c, the valve 243c, and the nozzle 249c.

From the gas supply pipe 232d, a precursor is supplied into the process chamber 201 via the MFC 241d, the valve 243d, the gas supply pipe 232a, and the nozzle 249a.

From the gas supply pipes 232e to 232g, an inert gas is supplied into the process chamber 201 via the MFCs 241e to 241g, the valve 243e to 243g, the gas supply pipes 232a to 232c, and the nozzles 249a to 249c, respectively. The inert gas acts as a purge gas, a carrier gas, a dilution gas and the like.

An adsorption inhibitor supply system is mainly constituted by the gas supply pipe 232a, the MFC 241a, and the valve 243a. A first reactant supply system is mainly constituted by the gas supply pipe 232b, the MFC 241b, and the valve 243b. A second reactant supply system is mainly constituted by the gas supply pipe 232c, the MFC 241c, and the valve 243c. A precursor supply system is mainly constituted by the gas supply pipe 232d, the MFC 241d, and the valve 243d. An inert gas supply system is mainly constituted by the gas supply pipes 232e to 232g, the MFCs 241e to 241g, and the valves 243e to 243g.

Among the various supply systems described above, some or all of the supply systems may be configured as an integrated supply system 248 in which the valves 243a to 243g, the MFCs 241a to 241g, and the like are integrated. The integrated supply system 248 is connected to each of the gas supply pipes 232a to 232g and is configured so that the operations of supplying various gases into the gas supply pipes 232a to 232g, i.e., the opening/closing operation of the valves 243a to 243g, the flow rate adjustment operation by the MFCs 241a to 241g, and the like are controlled by a controller 121 described later. The integrated supply system 248 is formed of integral type or a division type integrated units and may be attached to and detached from the gas supply pipes 232a to 232g and the like on an integrated unit basis. The integrated supply system 248 is configured so that the maintenance, replacement, expansion and the like of the integrated supply system 248 can be performed on an integrated unit basis.

An exhaust port 231a for exhausting the atmosphere in the process chamber 201 is provided in the lower portion of the side wall of the reaction tube 203. As shown in FIG. 2, the exhaust port 231a is provided at a position facing the nozzles 249a to 249c (gas supply holes 250a to 250c) with the wafers 200 interposed therebetween in a plan view. The exhaust port 231a may be provided to extend from the lower portion to the upper portion of the side wall of the reaction tube 203, i.e., along the wafer arrangement region. An exhaust pipe 231 is connected to the exhaust port 231a. The exhaust pipe 231 is made of a metallic material such as stainless steel or the like. A vacuum pump 246 as an evacuation device is connected to the exhaust pipe 231 via a pressure sensor 245 as a pressure detector (pressure detection part) for detecting the pressure inside the process chamber 201 and an APC (Auto Pressure Controller) valve 244 as a pressure regulator (pressure regulation part). The APC valve 244 is configured so that it can perform or stop vacuum evacuation of the interior of the process chamber 201 by being opened and closed in a state in which the vacuum pump 246 is operated. Furthermore, the APC valve 244 is configured so that it can regulate the pressure inside the process chamber 201 by adjusting the valve opening degree based on the pressure information detected by the pressure sensor 245 in a state in which the vacuum pump 246 is operated. An exhaust system is mainly constituted by the exhaust pipe 231, the APC valve 244 and the pressure sensor 245. The vacuum pump 246 may be included in the exhaust system.

A seal cap 219 as a furnace opening lid capable of airtightly closing the lower end opening of the manifold 209 is installed below the manifold 209. The seal cap 219 is made of a metallic material such as, for example, stainless steel or the like, and is formed in a disc shape. On the upper surface of the seal cap 219, there is installed an O-ring 220b as a seal member which abuts against the lower end of the manifold 209. Below the seal cap 219, there is installed a rotator 267 for rotating a boat 217 to be described later. A rotating shaft 255 of the rotator 267 is made of, for example, a metallic material such as stainless steel or the like and is connected to the boat 217 through the seal cap 219. The rotator 267 is configured to rotate the wafers 200 by rotating the boat 217. The seal cap 219 is configured to be raised and lowered in the vertical direction by a boat elevator 115 as an elevating mechanism installed outside the reaction tube 203. The boat elevator 115 is configured as a transfer device (transfer mechanism) that loads and unloads (transfers) the wafers 200 into and out of the process chamber 201 by raising and lowering the seal cap 219. Below the manifold 209, a shutter 219s is installed as a furnace opening lid capable of airtightly closing the lower end opening of the manifold 209 in a state in which the seal cap 219 is lowered and the boat 217 is unloaded from the process chamber 201. The shutter 219s is made of a metallic material such as stainless steel or the like and is formed in a disk shape. An O-ring 220c as a seal member that comes into contact with the lower end of the manifold 209 is installed on the upper surface of the shutter 219s. The opening/closing operations (the elevating operation, the rotating operation, and the like) of the shutter 219s are controlled by a shutter opener/closer 115s.

A boat 217 as a substrate support tool is configured so as to support a plurality of wafers 200, for example, 25 to 200 wafers 200 in a horizontal posture and in multiple stages while vertically arranging the wafers 200 with the centers thereof aligned with each other, i.e., so as to arrange the wafers 200 at intervals. The boat 217 is made of a heat-resistant material such as, for example, quartz or SiC. Heat insulating plates 218 made of a heat-resistant material such as, for example, quartz or SiC, are supported in multiple stages at the bottom of the boat 217.

Inside the reaction tube 203, there is installed a temperature sensor 263 as a temperature detector. By adjusting the state of supply of electric power to the heater 207 based on the temperature information detected by the temperature sensor 263, the temperature inside the process chamber 201 becomes a desired temperature distribution. The temperature sensor 263 is installed along the inner wall of the reaction tube 203.

Figure 3:
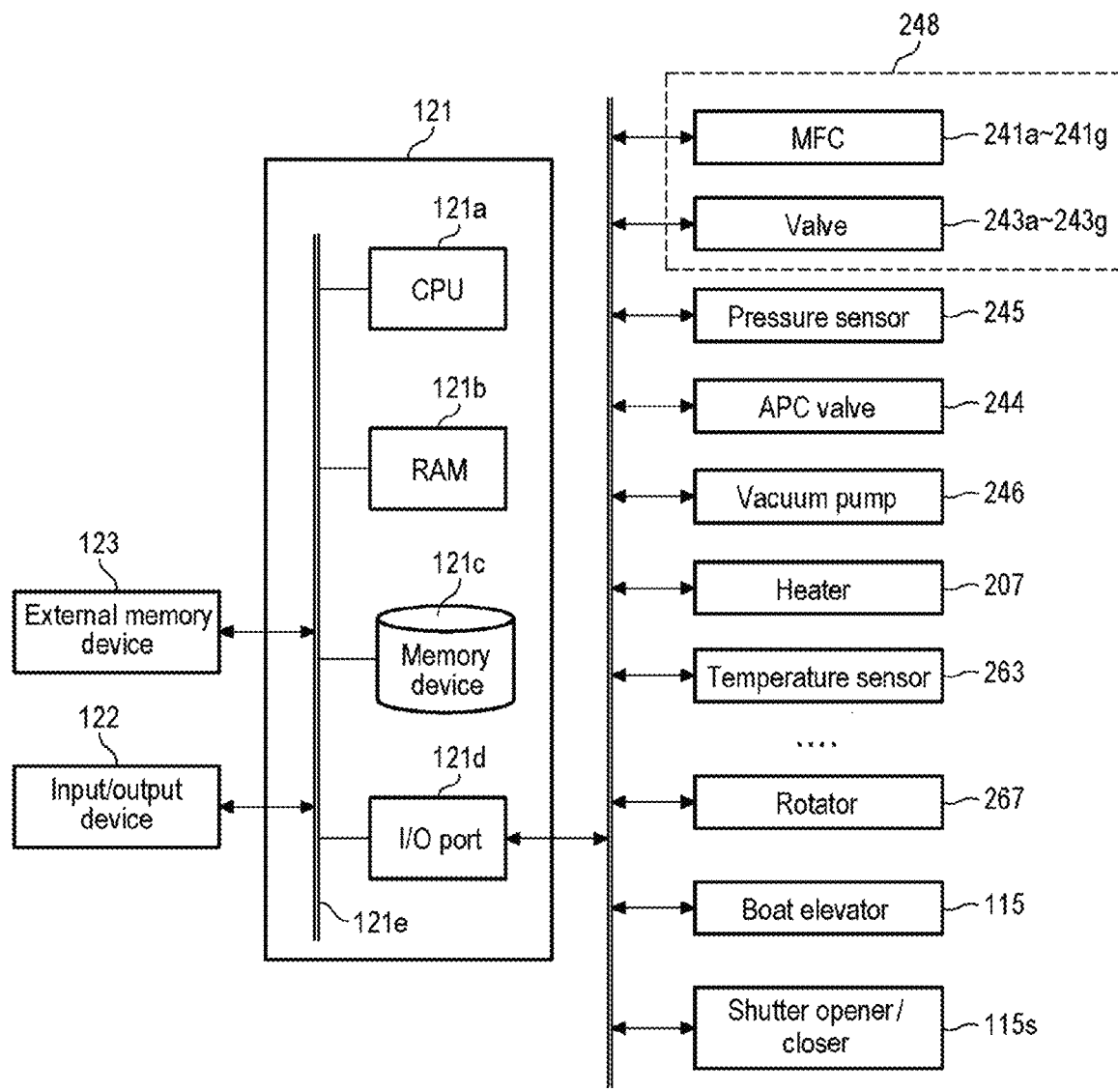
FIG. 3 is a schematic configuration diagram of a controller 121 of the substrate processing apparatus suitably used in embodiments of the present disclosure, in which a control system of the controller 121 is illustrated in a block diagram.

As shown in FIG. 3, the controller 121 as a control part (control means) is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 configured as, for example, a touch panel or the like is connected to the controller 121.

The memory device 121c is composed of, for example, a flash memory, an HDD (Hard Disk Drive), an SSD (Solid State Drive), or the like. In the memory device 121c, there are readably stored a control program for controlling the operation of the substrate processing apparatus, a process recipe in which procedures and conditions of substrate processing to be described later are written, and the like. The process recipe is a combination for, by the controller 121, causing the substrate processing apparatus to execute the respective procedures in a below-described substrate processing process so as to obtain a predetermined result. The process recipe functions as a program. Hereinafter, the process recipe, the control program and the like are collectively and simply referred to as a program. Furthermore, the process recipe is also simply referred to as a recipe. When the term "program" is used herein, it may mean a case of including the recipe alone, a case of including the control program alone, or a case of including both the recipe and the control program. The RAM 121b is configured as a memory area (work area) in which programs, data and the like read by the CPU 121a are temporarily held.

The I/O port 121d is connected to the MFCs 241a to 241g, the valves 243a to 243g, the pressure sensor 245, the APC valve 244, the vacuum pump 246, the temperature sensor 263, the heater 207, the rotator 267, the boat elevator 115, the shutter opener/closer 115s, and the like.

The CPU 121a is configured to read and execute the control program from the memory device 121c and to read the recipe from the memory device 121c in response to an input of an operation command from the input/output device 122 or the like. The CPU 121a is configured to, according to the contents of the recipe thus read, control the flow rate adjustment operation of various gases by the MFCs 241a to 241g, the opening/closing operations of the valves 243a to 243g, the opening/closing operation of the APC valve 244, the pressure regulation operation by the APC valve 244 based on the pressure sensor 245, the start and stop of the vacuum pump 246, the temperature adjustment operation of the heater 207 based on the temperature sensor 263, the rotation and the rotation speed adjustment operation of the boat 217 by the rotator 267, the raising and lowering operation of the boat 217 by the boat elevator 115, the opening/closing operation of the shutter 219s by the shutter opener/closer 115s, and the like.

The controller 121 may be configured by installing, in the computer, the above-described program stored in an external memory device 123. The external memory device 123 includes, for example, a magnetic disk such as an HDD or the like, an optical disk such as a CD or the like, a magneto-optical disk such as an MO or the like, a semiconductor memory such as a USB memory, an SSD or the like, and so forth. The memory device 121c and the external memory device 123 are configured as a computer readable recording medium. Hereinafter, the memory device 121c and the external memory device 123 are collectively and simply referred to as a recording medium. As used herein, the term "recording medium" may include the memory device 121c alone, the external memory device 123 alone, or both. The provision of the program to the computer may be performed by using a communication means such as the Internet or a dedicated line without having to use the external memory device 123.

(2) Substrate Processing Process

As one process of manufacturing a semiconductor device using the substrate processing apparatus described above, an example of a sequence in which a film is formed in a concave portion 200a provided on the surface of a wafer 200 will be described mainly with reference to FIGS. 4A to 4G. In the following description, the operation of each part constituting the substrate processing apparatus is controlled by the controller 121.

As shown in FIGS. 4A to 4G, in the processing sequence according to the present embodiment, a film 600 is formed in a concave portion 200a provided on the surface of the wafer 200 by performing a cycle a predetermined number of times, the cycle including non-simultaneously performing:
- (a) step A of forming an adsorption inhibition layer 300 by supplying an adsorption inhibitor, which inhibits adsorption of a precursor, to the wafer 200 and adsorbing the adsorption inhibitor on adsorption sites of an upper portion in the concave portion 200a;
- (b) step B of forming a first layer 400 by supplying the precursor to the wafer 200 and adsorbing the precursor on adsorption sites existing in the concave portion 200a in which the adsorption inhibition layer 300 is formed; and
- (c) step C of modifying the adsorption inhibition layer 300 and the first layer 400 into a second layer 500 by supplying a first reactant, which chemically reacts with both the adsorption inhibition layer 300 and the first layer 400, to the wafer 200. FIGS. 4A to 4G show an example in which the film 600 is formed so as to fill the inside of the concave portion 200a.

In the subject specification, the processing sequence in the above-described present embodiment may be denoted as follows for the sake of convenience. The same notation is used in the following descriptions of other embodiments and modifications.

(adsorption inhibitor→precursor→first reactant)×n

When the term "wafer" is used herein, it may refer to "a wafer itself" or "a laminated body of a wafer and a predetermined layer or film formed on the surface of the wafer." When the phrase "a surface of a wafer" is used herein, it may refer to "a surface of a wafer itself" or "a surface of a predetermined layer or the like formed on a wafer." When the expression "a predetermined layer is formed on a wafer" is used herein, it may mean that "a predetermined layer is directly formed on a surface of a wafer itself" or that "a predetermined layer is formed on a layer or the like formed on a wafer." When the term "substrate" or "concave portion" that is a portion of the substrate is used herein, it may be synonymous with the term "wafer."

In the present specification, the term "the upper portion in the concave portion" includes an edge of the concave portion and means an upper half of the concave portion with respect to the depth of the concave portion. On the other hand, the "a lower portion in the concave portion" means a portion below the "the upper portion in the concave portion" and includes a bottom surface of the concave portion.

(Wafer Charging and Boat Loading)

When a plurality of wafers 200 is charged to the boat 217 (wafer charging), the shutter 219s is moved by the shutter opener/closer 115s to open the lower end opening of the manifold 209 (shutter opening). Thereafter, as shown in FIG. 1, the boat 217 supporting the plurality of wafers 200 is lifted by the boat elevator 115 and loaded into the process chamber 201 (boat loading). In this state, the seal cap 219 seals the lower end of the manifold 209 via the O-ring 220b.

Figure 4A:
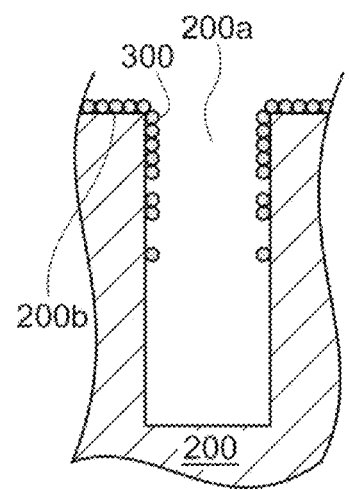
FIGS. 4A to 4G are partially enlarged cross-sectional views showing an example of a substance formed in each step of a processing sequence according to embodiments of the present disclosure.

As shown in FIG. 4A, a concave portion 200a is provided on the surface of the wafer 200 to be charged into the boat 217. The surface in the concave portion 200a of the wafer 200 (the surface of the inner wall of the concave portion 200a) and the upper surface 200b, which is a portion other than the concave portion 200a of the wafer 200, contain NH groups that are adsorption sites over the entire region (entire surface). That is, the surface in the concave portion 200a of the wafer 200 and the upper surface 200b of the wafer 200 are terminated with NH groups over the entire region (entire surface). The NH groups as adsorption sites are also referred to as NH terminals.

(Pressure Regulation and Temperature Adjustment)

Thereafter, the interior of the process chamber 201, that is, the space where the wafer 200 exists, is vacuum-exhausted (depressurization-exhausted) by the vacuum pump 246 to reach a desired pressure (degree of vacuum). At this time, the pressure in the process chamber 201 is measured by the pressure sensor 245, and the APC valve 244 is feedback-controlled based on the measured pressure information. Furthermore, the wafer 200 in the process chamber 201 is heated by the heater 207 to a desired processing temperature. At this time, the degree of supplying electric power to the heater 207 is feedback-controlled based on the temperature information detected by the temperature sensor 263 such that the interior of the process chamber 201 has a desired temperature distribution. Moreover, the rotation of the wafer 200 by the rotator 267 is started. The exhaust of the interior of the process chamber 201 and the heating and rotation of the wafer 200 are continuously performed at least until the processing on the wafer 200 is completed.

(Step A)

Thereafter, step A is performed. In step A, as shown in FIG. 4A, an adsorption inhibition layer 300 is formed by supplying an adsorption inhibitor, which inhibits adsorption of a precursor, to the wafer 200 with the concave portion 200a provided on the surface thereof and adsorbing the adsorption inhibitor on adsorption sites of an upper portion of the concave portion 200a.

Specifically, the valve 243a is opened to allow the adsorption inhibitor to flow into the gas supply pipe 232a. The flow rate of the adsorption inhibitor is adjusted by the MFC 241a. The adsorption inhibitor is supplied into the process chamber 201 via the nozzle 249a and is exhausted from the exhaust port 231a. At this time, the adsorption inhibitor is supplied to the wafer 200. At this time, the valves 243e to 243g may be opened to supply an inert gas into the process chamber 201 via the nozzles 249a to 249c, respectively.

An example of a processing condition when supplying the adsorption inhibitor in step A is described as follows.

Processing temperature: 400 to 800 degrees C., specifically 500 to 800 degrees C., more specifically 500 to 750 degrees C., even more specifically 600 to 750 degrees C.

Processing pressure: 1 to 2,666 Pa, specifically 10 to 266 Pa

Adsorption inhibitor supply flow rate: 0.1 to 1.5 slm, specifically 0.2 to 0.8 slm Adsorption inhibitor supply time: 5 to 60 seconds, specifically 5 to 55 seconds, more specifically 10 to 50 seconds, even more specifically 15 to 45 seconds, even more specifically 20 to 40 seconds.

Inert gas supply flow rate (for each gas supply pipe): 0 to 10 slm, specifically 1 to 3 slm As used herein, the notation of a numerical range such as "400 to 800 degrees C." means that the lower limit value and the upper limit value are included in the range. Therefore, for example, "400 to 800 degrees C." means "400 degrees C. or higher and 800 degrees C. or lower." The same applies to other numerical ranges. The processing temperature means the temperature of the wafer 200, and the processing pressure means the pressure in the process chamber 201. If there is a description of 0 sccm as the supply flow rate, it means that the substance is not supplied. These are the same in the following descriptions.

The processing temperature in step A is desirably a temperature lower than a thermal decomposition temperature of the adsorption inhibitor, more desirably a temperature lower than the thermal decomposition temperature of the adsorption inhibitor and higher than a thermal decomposition temperature of the precursor. Within the above-mentioned processing temperature range (numerical range), the processing temperature may be set to a temperature lower than the thermal decomposition temperature of the adsorption inhibitor and may further be set to a temperature lower than the thermal decomposition temperature of the adsorption inhibitor and higher than the thermal decomposition temperature of the precursor. By setting the processing temperature in this way, the decomposition rate (specifically, the thermal decomposition rate) of the adsorption inhibitor in step A can be made lower than the decomposition rate (specifically, the thermal decomposition rate) of the precursor in step B. Further, a ratio of a surface reaction to a gas phase reaction in step A can be made higher than a ratio of a surface reaction to a gas phase reaction in step B.

By supplying the adsorption inhibitor to the wafer 200 under the above-mentioned processing condition, the adsorption inhibitor can be selectively (preferentially) adsorbed on the adsorption sites (NH terminals) of the upper portion of the concave portion 200a. As a result, the adsorption inhibition layer 300 can be selectively (preferentially) formed on the upper portion of the concave portion 200a.

In this regard, the expression "the adsorption inhibitor is selectively adsorbed on the upper portion of the concave portion 200a" means that an adsorption amount of the adsorption inhibitor at the upper portion of the concave portion 200a is made larger than an adsorption amount of the adsorption inhibitor at a portion other than the upper portion of the concave portion 200a, and includes a case where an adsorption amount of the adsorption inhibitor on a portion other than the upper portion of the concave portion 200a is zero. Further, the expression "the adsorption inhibition layer 300 is selectively formed on the upper portion of the concave portion 200a" means that a thickness of the adsorption inhibition layer 300 formed on the upper portion of the concave portion 200a is made larger than a thickness of the adsorption inhibition layer 300 formed on a portion other than the upper portion of the concave portion 200a, and includes a case where a thickness of the adsorption inhibition layer 300 formed on a portion other than the upper portion of the concave portion 200a is zero.

By adjusting an adsorption inhibitor supply time in the above-mentioned processing condition, the adsorption inhibitor can be selectively adsorbed on the upper portion of the concave portion 200a with high uniformity. That is, by setting the adsorption inhibitor supply time to a predetermined time within the above-mentioned numerical range, the adsorption inhibitor can be selectively adsorbed on the upper portion of the concave portion 200a. Further, by setting the adsorption inhibitor supply time to a predetermined time within the above-mentioned numerical range, the adsorption inhibitor can be adsorbed on the upper portion of the concave portion 200a with high uniformity. By setting the adsorption inhibitor supply time to be equal to or less than the precursor supply time in step B, the above adjustment can be easily performed. Further, by setting the adsorption inhibitor supply time to be less than the precursor supply time in step B, the above-mentioned adjustment can be more easily performed. The term "uniformity" as used herein includes both WiW (Within Wafer) uniformity and WtW (Wafer to Wafer) uniformity of the amount of the adsorption inhibitor adsorbed on the upper portion of the concave portion 200a. The WiW uniformity is the uniformity within the wafer surface, and the WtW uniformity is the uniformity between the wafers. Further, the WiW uniformity and the WtW uniformity of the adsorption amount of the adsorption inhibitor on the upper portion of the concave portion 200a are respectively synonymous with the WiW uniformity and the WtW uniformity of the thickness of the adsorption inhibition layer 300 formed on the upper portion of the concave portion 200a.

If the adsorption inhibitor supply time is longer than 60 seconds (exceeds 60 seconds) which is an upper limit of the above numerical range (exceeds 60 seconds), an amount of the adsorption inhibitor reaching the lower portion of the concave portion 200a may increase, so that an adsorption amount of the adsorption inhibitor on the lower portion of the concave portion 200a may increase. As a result, it may be difficult to selectively adsorb the adsorption inhibitor on the upper portion of the concave portion 200a. By setting the adsorption inhibitor supply time to 60 seconds or less, it is possible to suppress an increase in an amount of the adsorption inhibitor reaching the lower portion of the concave portion 200a, so that it is possible to suppress an increase in an adsorption amount of the adsorption inhibitor on the lower portion of the concave portion 200a. That is, it is possible to maintain a state in which an amount of the adsorption inhibitor reaching the lower portion of the concave portion 200a is small, so that it is possible to maintain a state in which an adsorption amount of the adsorption inhibitor on the lower portion of the concave portion 200a is small. As a result, the adsorption inhibitor can be selectively adsorbed on the upper portion of the concave portion 200a. That is, it is possible to selectively form the adsorption inhibition layer 300 on the upper portion of the concave portion 200a. By setting the adsorption inhibitor supply time to 55 seconds or less, it is possible to enhance this action. By setting the adsorption inhibitor supply time to 50 seconds or less, it is possible to further enhance this action. By setting the adsorption inhibitor supply time to 45 seconds or less, it is possible to further enhance this action. By setting the adsorption inhibitor supply time to 40 seconds or less, it is possible to further enhance this action.

Further, if the adsorption inhibitor supply time is shorter than 5 seconds (less than 5 seconds) which is the lower limit of the above numerical range, a supply amount of the adsorption inhibitor may be insufficient. If the supply amount of the adsorption inhibitor is insufficient, the adsorption inhibitor may not reach the entire surface of the wafer 200, and the WiW uniformity of the adsorption amount of the adsorption inhibitor on the upper portion in the concave portion 200a may deteriorate. Further, if the supply amount of the adsorption inhibitor is insufficient, the adsorption inhibitor may not reach all the plurality of wafers 200, and the WtW uniformity of the adsorption amount of the adsorption inhibitor on the upper portion of the concave portion 200a may deteriorate. By setting the adsorption inhibitor supply time to 5 seconds or more, it is possible to prevent the adsorption inhibitor from being insufficiently supplied to the plane of the wafer 200 or to the plurality of wafers 200. As a result, the adsorption inhibitor can reach the entire plane of the wafer 200, which makes it possible to suppress deterioration of WiW uniformity of the adsorption amount of the adsorption inhibitor on the upper portion of the concave portion 200a. Further, the adsorption inhibitor can reach all the plurality of wafers 200, which makes it possible to suppress deterioration of WtW uniformity of the adsorption amount of the adsorption inhibitor on the upper portion of the concave portion 200a. That is, it is possible to maintain both the WiW uniformity and the WtW uniformity of the adsorption amount of the adsorption inhibitor on the upper portion of the concave portion 200a in a good state. By setting the adsorption inhibitor supply time to 10 seconds or more, it is possible to enhance this action. By setting the adsorption inhibitor supply time to 15 seconds or more, it is possible to further enhance this action. By setting the adsorption inhibitor supply time to 20 seconds or more, it is possible to further enhance this action.

Subsequently, an adsorption form of the adsorption inhibitor at the adsorption sites in the concave portion 200a will be described. Under the above-mentioned processing condition, a "residue of the adsorption inhibitor", which is a mother nucleus formed by dissociation of, for example, one substituent from the adsorption inhibitor, can be chemically adsorbed on the adsorption sites (NH terminals) on the surface of the wafer 200. Further, under the above-mentioned processing condition, the structure of the "residue of the adsorption inhibitor", which is the mother nucleus, is retained when chemically adsorbed on the adsorption sites. That is, the structure of the portion of the "residue of the adsorption inhibitor" other than the portion where the substituent is dissociated is maintained as it is. In this way, the adsorption inhibitor is adsorbed on the adsorption sites in the concave portion 200a provided on the surface of the wafer 200. The substituents dissociated from the adsorption inhibitor are bonded to each other or the substituents are bonded to the groups dissociated from the adsorption sites, thereby becoming gaseous substances. Under the processing condition described above, these reactions will be selectively generated in the upper portion of the concave portion 200a.

As described above, in step A, as shown in FIG. 4A, the adsorption inhibition layer 300 can be selectively formed on the upper portion of the concave portion 200a provided on the surface of the wafer 200. As described above, since the wafer 200 also contains adsorption sites (NH terminals) at the portion other than the concave portion 200a (i.e., the upper surface 200b), in step A, the residue of the adsorption inhibitor is also chemically adsorbed on the portion of the wafer other than the concave portion 200a (i.e., the upper surface 200b). As a result, as shown in FIG. 4A, the adsorption inhibition layer 300 is also formed on the upper surface 200b of the wafer 200.

As described above, in step A, the adsorption inhibition layer 300 is selectively formed on the upper portion of the concave portion 200a provided on the surface of the wafer 200 and the portion of the wafer 200 other than the concave portion 200a (i.e., the upper surface 200b). Since the adsorption inhibitor and its residue have a function of inhibiting the adsorption of the precursor, the adsorption inhibition layer 300 formed by chemical adsorption of the residue of the adsorption inhibitor also has a function of inhibiting the adsorption of the precursor. Further, since the residue of the adsorption inhibitor chemically adsorbed on the adsorption sites on the surface of the wafer 200 also inhibits the adsorption of the residue of the other adsorption inhibitor, an adsorption inhibition layer 300 having a substantially uniform thickness is formed on the upper portion of the concave portion 200a provided on the surface of the wafer 200 and on the upper surface 200b of the wafer 200.

After the adsorption inhibition layer 300 is formed on the upper portion of the concave portion 200a of the wafer 200, the valve 243a is closed to stop the supply of the adsorption inhibitor into the process chamber 201. Then, the interior of the process chamber 201 is vacuum-exhausted to remove the adsorption inhibitor, the gaseous substance and the like remaining in the process chamber 201 from the interior of the process chamber 201. At this time, the valves 243e to 243g are opened to supply an inert gas into the process chamber 201 via the nozzles 249a to 249c. The inert gas supplied from the nozzles 249a to 249c acts as a purge gas, whereby the interior of the process chamber 201 is purged (purging).

An example of a processing condition when performing the purging in step A is described as follows.

Processing temperature: 400 to 800 degrees C., specifically 500 to 800 degrees C., more specifically 500 to 750 degrees C., even more specifically 600 to 750 degrees C.
    Processing pressure: 1 to 500 Pa, specifically 20 to 100 Pa
    Inert gas supply flow rate (for each gas supply pipe): 0 to 10 slm, specifically 1 to 5 slm
    Inert gas supply time: 5 to 60 seconds, specifically 20 to 40 seconds As described above, under the above-mentioned processing condition, when the residue of the adsorption inhibitor is chemically adsorbed on the adsorption sites on the surface of the upper portion of the concave portion 200a or the adsorption sites on the upper surface 200b of the wafer 200 in step A, the structure thereof is retained as it is. Therefore, the residue of the adsorption inhibitor after chemical adsorption on the adsorption sites basically does not include dangling bonds. However, for some reasons, a small part of the residue of the adsorption inhibitor after chemical adsorption on the adsorption sites may include dangling bonds. In this case, the dangling bonds of the small part of the residue of the adsorption inhibitor become new adsorption sites, and the precursor supplied in step B may be adsorbed on the new adsorption sites. That is, depending on the structure of the residue of the adsorption inhibitor chemically adsorbed on the adsorption sites on the surface of the upper portion of the concave portion 200a, the precursor may be adsorbed on the residue of the adsorption inhibitor. That is, the "adsorption inhibitor" in the present specification may have a function of inhibiting the adsorption of the precursor from being directly adsorbed on the adsorption sites (NH terminals) of the surface of the upper portion of the concave portion 200a, and may allow the precursor to be adsorbed on the adsorption inhibitor or the residue of the adsorption inhibitor. Therefore, the adsorption inhibition layer 300 composed of the residue of the adsorption inhibitor also allows some precursor to be adsorbed thereon.

Further, in step A, there may be a case that a region on which the residue of the adsorption inhibitor is not adsorbed may be formed in a part of the upper portion of the concave portion 200a of the wafer 200. Specifically, in step A, there may be a case that the residue of the adsorption inhibitor, which is a portion inhibiting the adsorption of the precursor, may not be adsorbed on all the adsorption sites (NH terminals) existing in the upper portion of the concave portion 200a of the wafer 200. In this case, if the adsorption sites remain in the upper portion of the concave portion 200a of the wafer 200 after step A is performed, the precursor supplied in step B may be adsorbed on the adsorption sites. That is, after step B is performed, the "adsorption inhibition layer 300" formed in step A and the "first layer 400" formed in step B may be mixed on the upper portion of the concave portion 200a of the wafer 200.

Further, as described above, in step A, a small amount of the adsorption inhibitor may be adsorbed on the lower portion (including the bottom portion) of the concave portion 200a formed on the surface of the wafer 200. However, under the above-mentioned processing condition, the amount of the adsorption inhibitor adsorbed on the lower portion (including the bottom portion) of the concave portion 200a is smaller than that adsorbed on the upper portion of the concave portion 200a, and the amount of the adsorption inhibitor adsorbed on the upper portion of the concave portion 200a becomes overwhelmingly large. That is, the density (i.e., the surface coverage) of the adsorption inhibition layer 300 formed on the lower portion (including the bottom portion) of the concave portion 200a is much sparser than the density (i.e., the surface coverage) of the adsorption inhibition layer 300 formed in the upper portion of the concave portion 200a. Therefore, as described above, in the present disclosure, the expression "the adsorption inhibition layer 300 is (selectively) formed on the upper portion of the concave portion 200a" includes not only a case where the adsorption inhibition layer 300 is not formed at all on the lower portion (including the bottom portion) of the concave portion 200a and is formed only on the upper portion of the concave portion 200a, but also a case where a low-density adsorption inhibition layer 300 is formed in a very small region of the lower portion (including the bottom portion) of the concave portion 200a but a high-density adsorption inhibition layer 300 in the upper portion in the concave portion 200a is formed in a much wider region than that of the lower portion of the concave portion 200a.

—Adsorption Inhibitor—

As the adsorption inhibitor, a compound containing sites that inhibit adsorption of a precursor may be used. From the viewpoint of increasing the film formation rate to be described later, it is desirable that the adsorption inhibitor contains a main element constituting the film formed in the concave portion 200a. Examples of the main element include a semiconductor element such as silicon (Si), germanium (Ge) or the like, and a metal element such as titanium (Ti), zirconium (Zr), hafnium (Hf) or the like. Further, it is desirable that the adsorption inhibitor contains a halogen element from the viewpoint of adsorptivity for the adsorption sites (NH terminals) and from the viewpoint of inhibiting the adsorption of the precursor in step B. Among them, it is desirable that the adsorption inhibitor contains at least one selected from the group of chlorine (Cl), fluorine (F), bromine (Br), and iodine (I). More desirably, the adsorption inhibitor contains Cl. It is desirable that the thermal decomposition temperature of the adsorption inhibitor is higher than the thermal decomposition temperature of the precursor.

As the adsorption inhibitor, for example, halosilane may be used. Above all, it is desirable to use chlorosilane as the adsorption inhibitor. Herein, the term "halosilane" means a silane having a halogen element as a substituent, and the term "chlorosilane" means a silane having Cl as a substituent. There may be Cl, F, Br, and I as examples of the halogen element contained in halosilane. As the adsorption inhibitor, it is particularly desirable to use halosilane in which the number of Si contained in one molecule is one. Above all, it is desirable to use chlorosilane in which the number of Si contained in one molecule is one.

As the adsorption inhibitor, for example, a compound represented by formula [a1]: $SiX_3R$ (where three Xs each independently denote Cl, F, Br, or I and R denotes Cl, F, Br, I, an alkyl group, or an amino group) may be used. Above all, as the adsorption inhibitor, it is desirable to use a compound represented by formula [a2]: $SiCl_3R$ (where R denotes Cl, F, Br, I, an alkyl group, or an amino group). In this regard, as the alkyl group denoted by R, an alkyl group having 1 to 5 carbon atoms is desirable, and an alkyl group having 1 to 4 carbon atoms is particularly desirable. The alkyl group denoted by R may be linear or branched. Specific examples of the alkyl group denoted by R include a methyl group, an ethyl group, an n-propyl group, an n-butyl group, an isopropyl group, an isobutyl group, a sec-butyl group, a tert-butyl group, and the like. Further, the amino group denoted by R may be an amino group ($-NH_2$) or a substituted amino group. As the substituent contained in the substituted amino group, an alkyl group is desirable, an alkyl group having 1 to 5 carbon atoms is more desirable, and an alkyl group having 1 to 4 carbon atoms is particularly desirable. It is desirable that the alkyl group contained in the substituted amino group is the same as the alkyl group denoted by R, and specific examples thereof are also the same. The number of substituents of the substituted amino group is 1 or 2, specifically 2. When the number of substituents of the substituted amino group is 2, the two substituents may be identical to each other or different from each other.

As the adsorption inhibitor, for example, a tetrachlorosilane ($SiCl_4$, abbreviation: STC) gas, a trichlorosilane ($HSiCl_3$, abbreviation: TCS) gas, a trichloromethylsilane ($CH_3SiCl_3$) gas, a trichloroethylsilane ($C_2H_5SiCl_3$) gas, a trichloro(dimethylamino)silane ($(CH_3)_2NSiCl_3$) gas, a trichloro(diethylamino)silane ($(C_2H_5)_2NSiCl_3$) gas, and the like may be used. As the adsorption inhibitor, one or more of these may be used. As described above, when the adsorption inhibitor contains Si, the adsorption inhibitor also acts as a Si source.

As described above, the adsorption inhibition layer 300 formed in step A is composed of residues (i.e., the mother nuclei described above) in which substituents are dissociated from the adsorption inhibitor. For example, when the adsorption inhibitor exemplified above is used, it is desirable that the adsorption inhibition layer 300 formed in step A has a partial structure in which three halogens as the residues of the adsorption inhibitor are bonded to the atom of the main element. Above all, it is desirable that the adsorption inhibition layer 300 formed in step A has a partial structure in which three Cls are bonded to the atom of the main element. In this regard, when the main element is, for example, Si, it is desirable that the adsorption inhibition layer 300 formed in step A has, for example, a partial structure represented by $SiCl_3$.

—Inert Gas—

As the inert gas, for example, a rare gas such as an argon (Ar) gas, a helium (He) gas, a neon (Ne) gas, a xenon (Xe) gas, or the like may be used in addition to the nitrogen ($N_2$) gas. As the inert gas, one or more of these may be used. This point is the same in each of the below-described steps in which the inert gas is used. The inert gas acts as a purge gas, a carrier gas, a dilution gas, and the like.

(Step B)

Figure 4B:
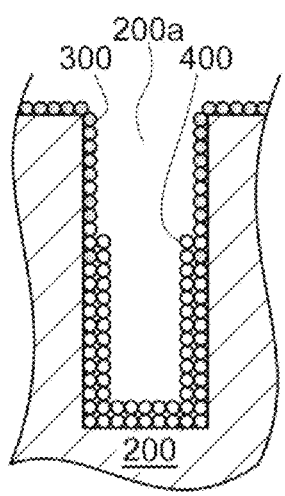

After step A is completed, step B is performed. In step B, as shown in FIG. 4B, a first layer 400 is formed by supplying a precursor to the wafer 200 and adsorbing the precursor on the adsorption sites existing in the concave portion 200a in which the adsorption inhibition layer 300 is formed.

Specifically, the valve 243d is opened to allow the precursor to flow into the gas supply pipe 232d. The flow rate of the precursor is adjusted by the MFC 241d. The precursor is supplied into the process chamber 201 via the nozzle 249a and is exhausted from the exhaust port 231a. At this time, the precursor is supplied to the wafer 200. At this time, the valves 243e to 243g may be opened to supply the inert gas into the process chamber 201 via the nozzles 249a to 249c, respectively.

An example of a processing condition when supplying the precursor in step B is described as follows.

Processing temperature: 400 to 800 degrees C., specifically 500 to 800 degrees C., more specifically 500 to 750 degrees C., even more specifically 600 to 750 degrees C.

Processing pressure: 1 to 2,666 Pa, specifically 10 to 266 Pa

Precursor supply flow rate: 0.1 to 1.5 slm, specifically 0.1 to 0.5 slm

Precursor supply time: 10 to 80 seconds, specifically 15 to 60 seconds, more specifically 20 to 50 seconds Inert gas supply flow rate (for each gas supply pipe): 0 to 10 slm, specifically 3 to 7 slm The processing temperature in step B is desirably a temperature higher than the thermal decomposition temperature of the precursor, and more desirably a temperature higher than the thermal decomposition temperature of the precursor and lower than the thermal decomposition temperature of the adsorption inhibitor. If it falls within the above-mentioned processing temperature range (numerical range), the processing temperature can be set to a temperature higher than the thermal decomposition temperature of the precursor, and can further be set to a temperature higher than the thermal decomposition temperature of the precursor and lower than the thermal decomposition temperature of the adsorption inhibitor. By setting the processing temperature in this way, the decomposition rate (specifically, the thermal decomposition rate) of the precursor in step B can be made higher than the decomposition rate (specifically, the thermal decomposition rate) of the adsorption inhibitor in step A. Further, the ratio of the gas phase reaction to the surface reaction in step B may be made higher than the ratio of the gas phase reaction to the surface reaction in step A.

It is desirable that the processing temperature in step B and the processing temperature in step A are substantially the same conditions. This eliminates a need to change the temperature of the wafer 200, that is, to change the temperature in the process chamber 201 (change the set temperature of the heater 207) between steps A and B. As a result, a waiting time until the temperature of the wafer 200 is stabilized is not needed between the steps. Accordingly, it is possible to improve the throughput of the substrate processing, that is, the productivity of the film-forming process.

By supplying the precursor to the wafer 200 under the above-mentioned processing condition, the precursor can be adsorbed on the adsorption sites existing in the concave portion 200a in which the adsorption inhibition layer 300 is formed. As a result, the first layer 400 can be selectively (preferentially) formed in the portion of the concave portion 200a where the adsorption sites exist.

In this regard, the adsorption sites existing in the concave portion 200a mainly refer to the adsorption sites (NH terminals) existing in the region of the concave portion 200a where the adsorption inhibition layer 300 is not formed. The adsorption sites existing in the concave portion 200a also additionally include adsorption sites slightly existing in the surface of the adsorption inhibition layer 300 (the adsorption sites formed by dangling bonds of the residue of the adsorption inhibitor). Since most of the region in the concave portion 200a where the adsorption inhibition layer 300 is not formed corresponds to the lower portion of the concave portion 200a, in step B, the precursor is adsorbed mainly on the adsorption sites (NH terminals) existing in the lower portion of the concave portion 200a.

Subsequently, the adsorption form of the precursor on the adsorption sites existing in the concave portion 200a will be described. Under the above-mentioned processing condition, it is possible to chemically adsorb the thermally decomposed substances generated by thermally decomposing the precursor, that is, the intermediates on the adsorption sites existing in the concave portion 200a. Since the intermediates of the precursor contain a plurality of dangling bonds, the intermediates having the dangling bonds can be chemically adsorbed on the adsorption sites existing in the concave portion 200a via the dangling bonds and can also be bonded to each other. Therefore, in step B, the intermediates of the precursor can be multiple-deposited on the adsorption sites existing in the concave portion 200a. In this way, the precursor is adsorbed on the adsorption sites existing in the concave portion 200a of the wafer 200. The substituents dissociated from the precursor due to the thermal decomposition of the precursor become gaseous substances as the substituents are bonded to each other or the substituents are bonded to the groups dissociated from the adsorption sites. Under the above-mentioned processing condition, these reactions will be selectively generated in the portion other than the upper portion of the concave portion 200a.

As described above, in step B, as shown in FIG. 4B, the first layer 400 can be selectively formed on and around the lower portion of the concave portion 200a formed in the surface of the wafer 200. In particular, as described above, in step B, the intermediates of the precursor can be multiple-deposited on the adsorption sites existing in the concave portion 200a of the wafer 200. On the other hand, in step A, the residue of the adsorption inhibitor cannot be multiple-deposited on the adsorption sites existing in the concave portion 200a of the wafer 200. Thus, the thickness of the first layer 400 formed in step B can be made thicker than the thickness of the adsorption inhibition layer 300 formed in step A.

After the first layer 400 is formed in the concave portion 200a of the wafer 200, the valve 243d is closed to stop the supply of the precursor into the process chamber 201. Then, the precursor, gaseous substances, and the like remaining in the process chamber 201 are removed from the process chamber 201 according to the same processing procedure and processing condition as in the above-mentioned step A (purging).

—Precursor—

As the precursor, a compound containing a main element constituting a film to be formed in the concave portion 200a may be used. Further, it is desirable that the precursor contains a halogen element from the viewpoint of adsorptivity on the adsorption sites (NH terminals). Above all, the precursor desirably contains at least one selected from the group of Cl, F, Br, and I from the viewpoint of adsorptivity on the adsorption sites (NH terminals), and more desirably contains Cl among them. In addition, it is desirable that the thermal decomposition temperature of the precursor is lower than the thermal decomposition temperature of the adsorption inhibitor.

As the precursor, for example, halosilane may be used as in the case of the adsorption inhibitor. Above all, it is desirable to use chlorosilane as the precursor. As the precursor, it is particularly desirable to use halosilane in which the number of Si contained in one molecule is two or more (specifically two). Above all, it is desirable to use chlorosilane in which the number of Si contained in one molecule is two or more (specifically two). Furthermore, as the precursor, it is more desirable to use halosilane having a Si—Si bond in a molecule. Above all, it is more desirable to use chlorosilane having a Si—Si bond in a molecule.

As the precursor, for example, a monochlorosilane ($SiH_3Cl$, abbreviation: MCS) gas, a dichlorosilane ($SiH_2Cl_2$, abbreviation: DCS) gas, a monochlorodisilane ($Si_2H_5Cl$, abbreviation: MCDS) gas, a dichlorodisilane ($Si_2H_4Cl_2$, abbreviation: DCDS) gas, a pentachlorodisilane ($Si_2HCl_5$, abbreviation: PCDS) gas, a hexachlorodisilane ($Si_2Cl_6$, abbreviation: HCDS) gas, an octachlorotrisilane ($Si_3Cl_8$, abbreviation: OCTS) gas, and the like may be used. Further, as the precursor, it may be possible to use an alkylene chlorosilane-based compound such as a bis(trichlorosilyl)methane (($SiCl_3)_2CH_2$, abbreviation: BTCSM) gas, a 1,2-bis(trichlorosilyl) ethane (($SiCl_3)_2C_2H_4$, abbreviation: BTCSE) gas or the like, an alkylchlorosilane-based compound such as a 1,1,2,2-tetrachloro-1,2-dimethyldisilane (($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas or the like, and a compound having a cyclic structure composed of Si and C and containing halogen, such as a 1,1,3,3-tetrachloro-1,3-disilacyclobutane ($C_2H_4Cl_4Si_2$, abbreviation: TCDSCB) gas or the like. As the precursor, one or more of them may be used. As described above, when the precursor contains Si, the precursor acts as a Si source.

(Step C)

Figure 4C:
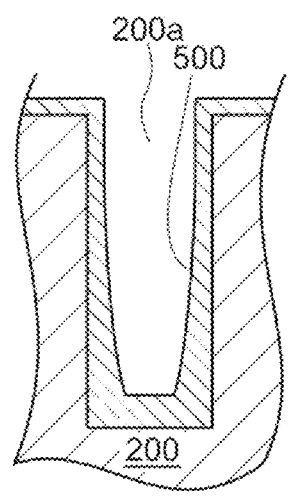

After step B is completed, step C is performed. In step C, as shown in FIG. 4C, the adsorption inhibition layer 300 and the first layer 400 are modified into a second layer 500 by supplying a first reactant, which chemically reacts with both the adsorption inhibition layer 300 and the first layer 400, to the wafer 200.

Specifically, the valve 243b is opened to allow the first reactant to flow into the gas supply pipe 232b. The flow rate of the first reactant is adjusted by the MFC 241b. The first reactant is supplied to the process chamber 201 via the nozzle 249b and is exhausted from the exhaust port 231a. At this time, the first reactant is supplied to the wafer 200. At this time, the valves 243e to 243g may be opened to supply the inert gas into the process chamber 201 via each of the nozzles 249a to 249c.

An example of a processing condition when supplying the first reactant in step C is described as follows.

Processing temperature: 400 to 800 degrees C., specifically 500 to 800 degrees C., more specifically 500 to 750 degrees C., even more specifically 600 to 750 degrees C.

Processing pressure: 1 to 4,000 Pa, specifically 600 to 1,000 Pa

First reactant supply flow rate: 1 to 10 slm, specifically 3 to 7 slm

First reactant supply time: 30 to 90 seconds, specifically 40 to 60 seconds

Other processing condition may be the same as the processing condition in step A.

It is desirable to set the processing temperature in step C and the processing temperatures in steps A and B to substantially the same condition. This eliminates a need to change the temperature of the wafer 200, that is, to change the temperature in the process chamber 201 among steps A, B, and C. As a result, the waiting time until the temperature of the wafer 200 is stabilized between the steps is not needed. Accordingly, it is possible to improve the throughput of the substrate processing, that is, the productivity of the film-forming process.

By supplying the first reactant to the wafer 200 under the above-mentioned processing condition, both the adsorption inhibition layer 300 and the first layer 400 can be modified into the second layer 500. That is, in step C, the first layer 400 formed in step B can be modified into the second layer 500 by the first reactant, and the adsorption inhibition layer 300 formed in step A can also be modified into the second layer 500 by the same first reactant. By modifying not only the first layer 400 but also the adsorption inhibition layer 300 into the second layer 500 in this way, it is possible to enhance the deposition rate and to improve the throughput of the substrate processing, that is, the productivity of the film-forming process.

Further, when the adsorption inhibition layer 300 is modified into the second layer 500, impurities contained in the adsorption inhibition layer 300 can be removed from the adsorption inhibition layer 300 in the process of the modifying reaction (e.g., nitriding reaction or the like) of the adsorption inhibition layer 300 by the first reactant. At that time, impurities existing at the interface between the adsorption inhibition layer 300 and the wafer 200 can also be removed. That is, when the adsorption inhibition layer 300 is modified into the second layer 500, it is possible to improve the layer quality of the second layer 500 and also improve the interface characteristics between the second layer 500 and the wafer 200. As a result, it is possible to improve the film quality of the finally formed film 600 and also improve the interface characteristics between the finally formed film 600 and the wafer 200.

Further, when the first layer 400 is modified into the second layer 500, impurities contained in the first layer 400 can be removed from the first layer 400 in the process of the modifying reaction (e.g., nitriding reaction or the like) of the first layer 400 by the first reactant. At that time, impurities existing at the interface between the first layer 400 and the wafer 200 can also be removed. That is, when the first layer 400 is modified into the second layer 500, it is possible to improve the layer quality of the second layer and also improve the interface characteristics between the second layer 500 and the wafer 200. As a result, it is possible to improve the film quality of the finally formed film 600 and also improve the interface characteristics between the finally formed film 600 and the wafer 200.

The modification of the adsorption inhibition layer 300 into the second layer 500 by the first reactant and the modification of the first layer 400 into the second layer 500 by the first reactant are performed simultaneously, that is, in parallel. That is, the above-mentioned modifying reaction based on the adsorption inhibition layer 300 and the above-mentioned modifying reaction based on the first layer 400 proceed simultaneously, that is, in parallel.

When the adsorption inhibition layer 300 and the first layer 400 are modified into the second layer 500 in step C, if the modifying reaction by the first reactant is, for example, a nitriding reaction, new adsorption sites (e.g., NH terminals) will be formed in the surface of the second layer 500 in the process of the modifying reaction. That is, by modifying the adsorption inhibition layer 300 into the second layer 500 in step C, the function of inhibiting the adsorption of the precursor, which is implemented by the adsorption inhibition layer 300, is temporarily reset. In other words, as the adsorption inhibition layer 300 is modified into the second layer 500 in step C, the function of inhibiting the adsorption of the precursor, which is implemented by the adsorption inhibition layer 300, disappears.

As described above, in step B, the thickness of the first layer 400 can be made thicker than the thickness of the adsorption inhibition layer 300. Therefore, in step C, as shown in FIG. 4C, the thickness of the second layer 500 formed by modifying the first layer 400 can be made thicker than the thickness of the second layer 500 formed by modifying the adsorption inhibition layer 300.

Further, in step C, it is desirable that the second layer 500 formed by modifying the first layer 400 and the second layer 500 formed by modifying the adsorption inhibition layer 300 have the same components. Herein, the expression "have the same components" means that the elements contained in the second layer 500 formed by modifying the first layer 400 and the elements contained in the second layer 500 formed by modifying the adsorption inhibition layer 300 are the same. The proportion (i.e., the composition) of the elements contained in the second layer 500 formed by modifying the first layer 400 and the elements contained in the second layer 500 formed by modifying the adsorption inhibition layer 300 may be different from each other. For example, when the concave portion 200a is filled with a film formed by stacking the second layer 500, even if the proportions of the elements contained in the second layer 500 formed by modifying the first layer 400 and the proportions of the elements contained in the second layer 500 formed by modifying the adsorption inhibition layer 300 are different from each other, there is no particular problem as long as the filled film as a whole has the required performance (e.g., the insulating property).

After modifying the adsorption inhibition layer 300 and the first layer 400 into the second layer 500, the valve 243b is closed to stop the supply of the first reactant into the process chamber 201. Then, according to the same processing procedure and processing condition as in the above-mentioned step A, the first reactant, the gaseous substance, and the like remaining in the process chamber 201 are removed from the process chamber 201 (purging).

—First Reactant—

As the first reactant, a compound capable of modifying both the adsorption inhibition layer 300 and the first layer 400 into the second layer 500 may be used. As the first reactant, for example, at least one selected from the group of a nitrogen (N)- and hydrogen (H)-containing gas, a carbon (C)- and nitrogen (N)-containing gas, a carbon (C)- and hydrogen (H)-containing gas, an oxygen (O)-containing gas, and a boron (B)-containing gas may be used from the viewpoint of the modification effect of modifying both the adsorption inhibition layer 300 and the first layer 400 into the second layer 500.

By selecting the gas species to be used as the first reactant, the components of the second layer 500 are determined. That is, by using at least one of the above-mentioned gas species as the first reactant in step C, the components contained in the first reactant, that is, the elements contained in at least one selected from the group of the N- and H-containing gas, the C- and N-containing gas, the C- and H-containing gas, the O-containing gas, and the B-containing gas can be added to the adsorption inhibition layer 300 and the first layer 400, which makes it possible to modify the layers (specifically, change the compositions of the films).

For example, when the adsorption inhibition layer 300 and the first layer 400 are Si-containing layers, a Si- and N-containing layer can be formed as the second layer 500 by using the N- and H-containing gas as the first reactant. Similarly, when the adsorption inhibition layer 300 and the first layer 400 are Si-containing layers, a Si-, C-, and N-containing layer can be formed as the second layer 500 by using the C- and N-containing gas as the first reactant. Similarly, when the adsorption inhibition layer 300 and the first layer 400 are Si-containing layers, a Si- and C-containing layer can be formed as the second layer 500 by using the C and H-containing gas as the first reactant. Similarly, when the adsorption inhibition layer 300 and the first layer 400 are Si-containing layers, a Si- and O-containing layer can be formed as the second layer 500 by using the O-containing gas as the first reactant. Similarly, when the adsorption inhibition layer 300 and the first layer 400 are Si-containing layers, a Si- and B-containing Si and B can be formed as the second layer 500 by using the B-containing gas as the first reactant.

As the N- and H-containing gas, it may be possible to use, for example, a hydrogen nitride-based gas containing an N—H bond, such as an ammonia ($NH_3$) gas, a hydrazine ($N_2H_4$) gas, a diazene ($N_2H_2$) gas, a $N_3H_8$ gas or the like may be used. As the C- and N-containing gas, it may be possible to use, for example, an amine-based gas such as a monoethylamine ($C_2H_5NH_2$, abbreviation: MEA) gas, a diethylamine (($C_2H_5)_2NH$, abbreviation: DEA) gas, a triethylamine (($C_2H_5)_3N$, abbreviation: TEA) gas, a monomethylamine ($CH_3NH_2$, abbreviation: MMA) gas, a dimethylamine (($CH_3)_2NH$, abbreviation: DMA) gas, a trimethylamine (($CH_3)_3N$, abbreviation: TMA) gas or the like, and an organic hydrazine-based gas such as a monomethylhydrazine (($CH_3)HN_2H_2$, abbreviation: MMH) gas, a dimethylhydrazine (($CH_3)_2N_2H_2$, abbreviation: DMH) gas, a trimethylhydrazine (($CH_3)_2N_2(CH_3)H$, abbreviation: TMH) gas or the like. These gases may also be referred to as C-, N-, and H-containing gases. As the C- and H-containing gas, it may be possible to use, for example, a hydrocarbon-based gas such as an ethylene ($C_2H_4$) gas, an acetylene ($C_2H_2$) gas, a propylene ($C_3H_6$) gas or the like. As the O-containing gas, it may be possible to use, for example, an oxidizing gas such as an oxygen ($O_2$) gas, a nitrogen monoxide (NO) gas, a nitrogen dioxide ($NO_2$) gas, a nitrous oxide (N2O) gas, a carbon monoxide (CO) gas, a carbon dioxide ($CO_2$), an ozone ($O_3$) gas, a water vapor ($H_2O$ gas), a hydrogen peroxide ($H_2O_2$) gas, $O_2$ gas+$H_2$ gas, $O_3$ gas+$H_2$ gas, or the like. As the B-containing gas, it may be possible to use, for example, a trichloroborane ($BCl_3$) gas, a diborane ($B_2H_6$) gas, a triethylborane (($C_2H_5)_3B$) gas, or the like.

In the present disclosure, the parallel recitation of two gases such as "$O_2$ gas+$H_2$ gas" means a mixed gas of $O_2$ gas and $H_2$ gas. When supplying the mixed gas, two gases may be mixed (premixed) in a supply pipe and then supplied into the process chamber 201, or two gases may be supplied separately from different supply pipes into the process chamber 201 and mixed (post-mixed) in the process chamber 201.

Further, as the first reactant, two or more types of gases selected from different groups among the five groups of N- and H-containing gases, C- and N-containing gases, C- and H-containing gases, O-containing gases and B-containing gases may be used in combination. The combinations include, for example, a combination of one type selected from the N- and H-containing gases and one type selected from the C- and N-containing gases, a combination of one type selected from the N- and H-containing gases and one type selected from the C- and H-containing gases, a combination of one type selected from the C- and N-containing gases and one type selected from the C- and H-containing gases, a combination of one type selected from the N- and H-containing gases and one type selected from the O-containing gases, a combination of one type selected from the N- and H-containing gases and one type selected from the B-containing gases, and so forth. In such a case, the two types of gases may be simultaneously supplied into the process chamber 201 separately from different gas supply systems.

(Performing a Predetermined Number of Times)

Figure 4D:
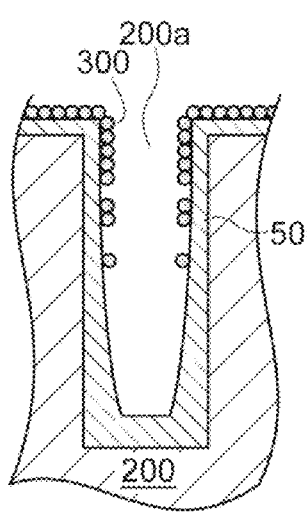
Figure 4E:
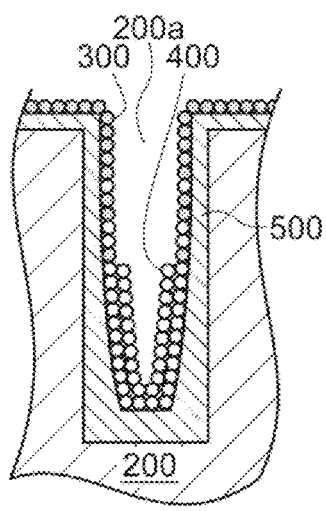
Figure 4F:
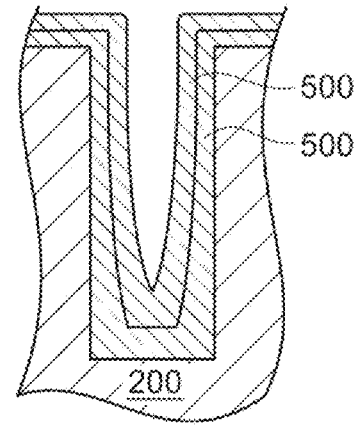
Figure 4G:
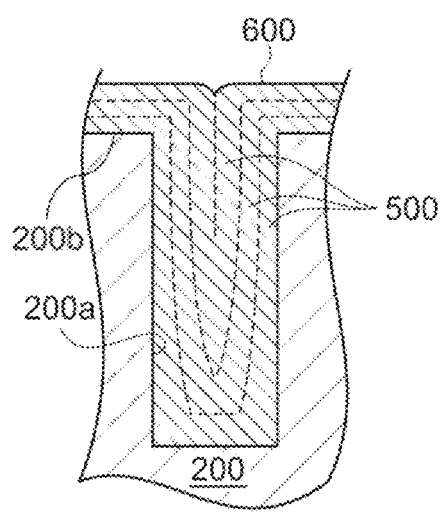

By performing, a predetermined number of times (n times where n is an integer of 1 or more), the above-mentioned cycle in which step A, step B and step C are performed non-simultaneously, that is, without synchronization, as shown in FIG. 4G, a film 600, which is a stacked body of the second layers 500, is formed in the concave portion 200a so as to fill the concave portion 200a. That is, by stacking the second layers 500 in the concave portion 200a, the entirety of the concave portion 200a is filled with the film 600 which is the stacked body of the second layers 500.

It is desirable that the above cycle is repeated a plurality of times. That is, it is desirable that the thickness of the second layer 500 formed per cycle is made smaller than a desired film thickness, and the above cycle is repeated a plurality of times until the film thickness of the film 600 formed by stacking the second layers 500 reaches the desired film thickness (i.e., until the concave portion 200a is filled with the film 600).

More specifically, it is desirable that as shown in FIGS. 4A to 4C, after performing a first cycle in which step A, step B, and step C are performed non-simultaneously, a second cycle in which step A, step B, and step C are performed non-simultaneously is performed. Specifically, as shown in FIG. 4C, in step C, the second layer 500 is formed on the entire surface of the concave portion 200a of the wafer 200. Thereafter, when the second cycle is performed, steps A, B, and C are performed non-simultaneously in the named order on the wafer 200 in which the concave portion 200a having the second layer 500 is formed on the surface thereof. According to step A of the second cycle, from the state of FIG. 4C, as shown in FIG. 4D, the adsorption inhibitor is adsorbed on the adsorption sites of the upper portion of the concave portion 200a having the second layer 500 on the surface thereof (i.e., the adsorption sites of the surface of the second layer 500), whereby an adsorption inhibition layer 300 is formed again. Subsequently, in step B, as shown in FIG. 4E, the precursor is adsorbed on the adsorption sites existing in the concave portion 200a in which the adsorption inhibition layer 300 is formed again (i.e., the adsorption sites on the surface of the second layer 500), whereby a first layer 400 is formed again. Further, subsequently, in step C, as shown in FIG. 4F, the adsorption inhibition layer 300 and the first layer 400 formed again on the surface of the second layer 500 are modified into the second layer 500 by the first reactant. In such a second cycle, the second layer 500 is secondly formed on the first-formed second layer 500 in the concave portion 200a. By performing the cycle a plurality of times, as shown in FIG. 4G, the entirety of the concave portion 200a is filled with the film 600 which is the stacked body of the second layer 500. By repeating, a plurality of times, the cycle in which step A, step B, and step C are repeated non-simultaneously, the same reaction as the reaction generated on the surface of the upper portion of the concave portion 200a is generated on the upper surface 200b of the wafer 200, whereby a film 600 is also formed on the upper surface 200b of the wafer 200.

When the above cycle is performed a predetermined number of times, it is desirable to control the balance of the processing time in each step. For example, it is desirable that the supply time of the adsorption inhibitor in step A is equal to or shorter than the supply time of the precursor in step B. Further, it is more desirable that the supply time of the adsorption inhibitor in step A is shorter than the supply time of the precursor in step B. Further, it is desirable that the supply time of the adsorption inhibitor in step A is made equal to or shorter than the supply time of the precursor in step B, and the supply time of the precursor in step B is made shorter than the supply time of the first reactant in step C. Further, it is desirable that the supply time of the adsorption inhibitor in step A is made shorter than the supply time of the precursor in step B, and the supply time of the precursor in step B is made shorter than the supply time of the first reactant in step C. As described above, by controlling the balance of the supply time of each of the adsorption inhibitor, the precursor, and the first reactant to be supplied in each of step A, step B, and step C, it is possible to efficiently generate and optimize the above-mentioned reaction in each step.

(After-Purge and Atmospheric Pressure Restoration)

After the film 600 is formed in the concave portion 200a of the wafer 200, an inert gas as a purge gas is supplied into the process chamber 201 from each of the nozzles 249a to 249c and is exhausted from the exhaust port 231a. As a result, the interior of the process chamber 201 is purged, and the gas, reaction by-products and the like remaining in the process chamber 201 are removed from the interior of the process chamber 201 (after-purging). Thereafter, the atmosphere in the process chamber 201 is replaced with the inert gas (inert gas replacement), and the pressure in the process chamber 201 is restored to the atmospheric pressure (atmospheric pressure restoration).

(Boat Unloading and Wafer Discharging)

Thereafter, the seal cap 219 is lowered by the boat elevator 115 to open the lower end of the manifold 209. Then, the processed wafers 200 supported by the boat 217 are unloaded from the lower end of the manifold 209 to the outside of the reaction tube 203 (boat unloading). After the boat is unloaded, the shutter 219s is moved and the lower end opening of the manifold 209 is sealed by the shutter 219s via the O-ring 220c (shutter closing). The processed wafers 200 are discharged out of the boat 217 after being unloaded from the reaction tube 203 (wafer discharging).

(3) Effects of the Present Embodiment

According to the present embodiment, one or more of the following effects may be obtained.

In step C, both the adsorption inhibition layer 300 formed in step A and the first layer 400 formed in step B are reacted with the first reactant and are modified into the second layer 500, whereby a high-quality film can be formed in the concave portion 200a formed in the surface of the wafer 200 at a high deposition rate. As a result, void-free and seamless filling can be performed in the concave portion 200a of the wafer 200 by a high-quality film at a high deposition rate. That is, according to the present embodiments, it is possible to improve the throughput of the substrate processing, that is, the productivity of the film-forming process, improve the quality of the film to be formed, and improve the filling characteristics of the concave portion.

For example, there is a method of forming a film in the concave portion 200a by adsorbing a reaction inhibitor, which is an organic compound, on the upper portion in the concave portion 200a. However, in the case of this method, the reaction inhibitor and the first reactant do not react with each other and the reaction inhibitor is not modified into the layer constituting the film to be formed. Further, in the case of this method, there is a high possibility that the residue (residual substance) of the reaction inhibitor is introduced into the formed film or the interface between the formed film and the wafer 200. On the other hand, in the case of the present embodiments, the adsorption inhibition layer 300 can be modified into the second layer 500 constituting the film 600 to be formed by reacting the adsorption inhibition layer 300 and the first reactant with each other. At that time, impurities (e.g., the residue of the adsorption inhibitor) contained in the adsorption inhibition layer 300 can be desorbed and removed. As a result, in the case of the present embodiments, it is possible to prevent the residue of the adsorption inhibitor from being introduced into the film formed in the concave portion 200a or the interface between the formed film and the wafer 200. That is, according to the present embodiments, a high-quality film can be formed at a higher deposition rate than that of the above-mentioned method using the reaction inhibitor which is an organic compound. As a result, it becomes possible to perform void-free and seamless filling in the concave portion 200a of the wafer 200 by a high-quality film at a high deposition rate. That is, according to the present embodiments, it is possible to improve the throughput of the substrate processing, that is, the productivity of the film-forming process, improve the quality of the film to be formed, and improve the filling characteristics of the concave portion.

By setting the processing temperature in step A to be lower than the thermal decomposition temperature of the adsorption inhibitor and setting the processing temperature in step B to be higher than the thermal decomposition temperature of the precursor, it is possible in step A to form the adsorption inhibition layer 300 without thermally decomposing the adsorption inhibitor and in step B to form the first layer 400 in which the thermal decomposition substance of the precursor, that is, the intermediate of the precursor is deposited, while thermally decomposing the precursor. Thus, the thickness of the first layer 400 formed in step B can be made thicker than the thickness of the adsorption inhibition layer 300 formed in step A. As a result, in step C, the thickness of the second layer 500 formed at the lower portion of the concave portion 200a can be made thicker than the thickness of the second layer 500 formed at the upper portion of the concave portion 200a. That is, the thickness of the second layer 500 formed by modifying the first layer 400 can be made thicker than the thickness of the second layer 500 formed by modifying the adsorption inhibition layer 300. From these facts, it is possible to cause the film formed by stacking the second layers 500 to grow upward from the bottom in the concave portion 200a. As a result, void-free and seamless filling can be performed in the concave portion 200a of the wafer 200. In this case, it is desirable that the thermal decomposition temperature of the adsorption inhibitor used in step A is higher than the thermal decomposition temperature of the precursor used in step B. That is, in step A, it is desirable to select an adsorption inhibitor having a thermal decomposition temperature higher than the thermal decomposition temperature of the precursor used in step B. This makes it possible to properly cause the above-mentioned reaction.

By setting the decomposition rate (specifically, the thermal decomposition rate) of the adsorption inhibitor in step A to be lower than the decomposition rate (specifically, the thermal decomposition rate) of the precursor in step B, the thickness of the first layer 400 formed in step B can be made thicker than the thickness of the adsorption inhibition layer 300 formed in step A. As a result, in step C, the thickness of the second layer 500 formed at the lower portion of the concave portion 200a can be made thicker than the thickness of the second layer 500 formed at the upper portion of the concave portion 200a, and it is possible to cause the film formed by stacking the second layers 500 to grow upward from the bottom in the concave portion 200a. As a result, void-free and seamless filling can be performed in the concave portion 200a of the wafer 200.

By setting the ratio of the surface reaction to the gas phase reaction in step A to be higher than the ratio of the surface reaction to the gas phase reaction in step B, the thickness of the first layer 400 formed in step B can be made thicker than the thickness of the adsorption inhibition layer 300 formed in step A. As a result, in step C, the thickness of the second layer 500 formed at the lower portion of the concave portion 200a can be made thicker than the thickness of the second layer 500 formed at the upper portion of the concave portion 200a, and it is possible to cause the film formed by stacking the second layers 500 to grow upward from the bottom in the concave portion 200a. As a result, void-free and seamless filling can be performed in the concave portion 200a of the wafer 200.

By setting the supply time of the adsorption inhibitor in step A to be equal to or less than the supply time of the precursor in step B, it is possible to efficiently generate each of the above-mentioned reactions in step A and step B. Further, by setting the supply time of the adsorption inhibitor in step A to be less than the supply time of the precursor in step B, it is possible to more efficiently generate each of the above-mentioned reactions in step A and step B.

By setting the supply time of the adsorption inhibitor in step A to be equal to or less than the supply time of the precursor in step B and setting the supply time of the precursor in step B to be less than the supply time of the first reactant in step C, it is possible to efficiently generate each of the above-mentioned reactions in step A, step B and step C. Further, by setting the supply time of the adsorption inhibitor in step A to be less than the supply time of the precursor in step B and setting the supply time of the precursor in step B to be less than the supply time of the first reactant in step C, it is possible to more efficiently generate each of the above-mentioned reactions in step A, step B and step C.

As described above, by controlling the balance of the supply time of each of the adsorption inhibitor, the precursor, and the first reactant to be supplied in each of step A, step B, and step C, it is possible to efficiently generate and optimize the above-mentioned reaction in each step.

In step C, it is possible to make the component of the second layer 500 formed by modifying the first layer 400 and the component of the second layer 500 formed by modifying the adsorption inhibition layer 300 to be the same. That is, in step C, it is possible to form the second layer 500 having the same component over the entire concave portion 200a. As a result, it is possible to form the film 600 formed by stacking the second layers 500 having the same component over the entire concave portion 200a. In addition, it is possible to cause the film 600 formed by stacking the second layers 500 having the same component to grow upward from the bottom in the concave portion 200a.

When both the adsorption inhibitor used in step A and the precursor used in step B contain the main element that constitutes the film 600 formed in the concave portion 200a, it is possible to introduce the main element constituting the film 600 into both the adsorption inhibition layer 300 and the first layer 400. Further, when all of the adsorption inhibitor used in step A and the precursor used in step B are a substance capable of forming a layer having the same component by reaction with the first reactant, it is possible in step C to modify both the adsorption inhibition layer 300 and the first layer 400 into the second layer 500 by the first reactant. That is, by using the first reactant that reacts with both the adsorption inhibitor and the precursor in step C, it is possible to modify not only the first layer 400 but also the adsorption inhibition layer 300 into the second layer 500. Accordingly, it is possible to enhance the deposition rate and to improve the throughput of the substrate processing, that is, the productivity of the film-forming process.

When both the adsorption inhibitor used in step A and the precursor used in step B contain a halogen element (desirably at least one selected from the group of Cl, F, Br, and I), it is possible to promote the adsorption of the adsorption inhibitor on the adsorption sites of the upper portion of the concave portion 200a in step A and to enhance an effect of inhibiting the adsorption of the precursor on the adsorption inhibition layer 300 in step B. Further, in this case, it may be possible in step B to promote the adsorption of the precursor on the adsorption sites existing in the concave portion 200a.

When each of the adsorption inhibitor used in step A and the precursor used in step B is halosilane (desirably chlorosilane), it is possible to efficiently generate the adsorption reaction of the adsorption inhibitor on the adsorption sites of the upper portion in the concave portion 200a in step A and the adsorption reaction of the precursor on the adsorption sites existing in the concave portion 200a in step B. Further, in this case, it is possible to further enhance an effect of inhibiting the adsorption of the precursor on the adsorption inhibition layer 300 in step B.

When the adsorption inhibition layer 300 formed in step A contains a partial structure in which three halogens are bonded to the atom of the main element (desirably a partial structure in which three Cls are bonded to the atom of the main element), it is possible to enhance an effect of inhibiting the adsorption of the precursor by the adsorption inhibition layer 300 by the presence of halogen and the number of halogens. The adsorption inhibition layer 300 having such a partial structure can be obtained by using, for example, the compound represented by the above formula [a1] (desirably the compound represented by the formula [a2]) as the adsorption inhibitor. That is, in step A, the adsorption inhibition layer 300 having a high effect of inhibiting the adsorption of the precursor can be obtained by using, for example, the compound represented by the above formula [a1] (desirably the compound represented by the formula [a2]) as the adsorption inhibitor.

(4) Modification

The processing sequence in the present embodiments described above may be changed as in the modifications shown below. These modifications can be combined arbitrarily. Unless otherwise specified, the processing procedure and processing condition in each step of each modification may be the same as the processing procedure and processing condition in each step of the above-described processing sequence.

Modification 1

As shown in FIGS. 5A to 5I, the cycle of the above-described processing sequence may further include step D in addition to the above-described steps A, B, and C. That is, as shown in FIGS. 5A to 5I, in the processing sequence of modification 1, there is shown an example of performing a cycle a predetermined number times, the cycle including non-simultaneously performing the above-described step A, the above-described step B, the above-described step C, and (d) step D of modifying the second layer 500 into a third layer 700 by supplying a second reactant, which has a molecular structure different from that of the first reactant, to the wafer 200. FIGS. 5A to 5I show an example in which a film 800 is formed so as to fill the inside of the concave portion 200a. The processing sequence in modification 1 may be expressed as follows.

(adsorption inhibitor→precursor→first reactant→second reactant)×n (Step D)

Figure 5A:
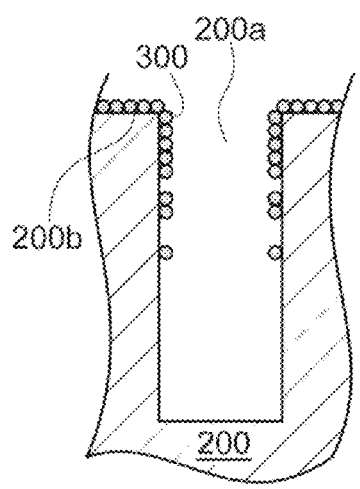
Figure 5B:
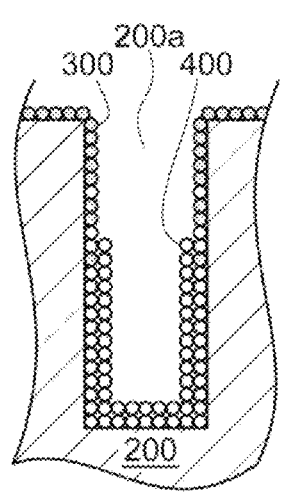
Figure 5C:
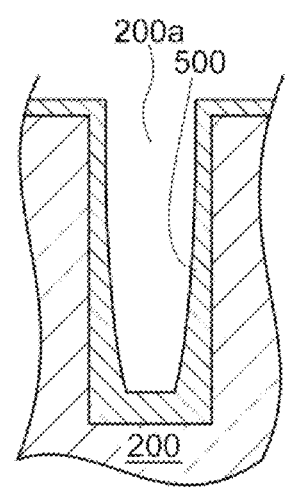
Figure 5D:
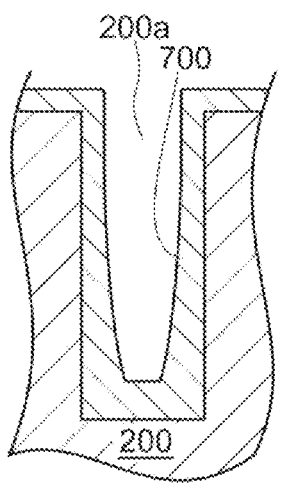

In modification 1, step D is performed after the above-described step C is completed. In step D, as shown in FIG. 5D, the second layer 500 is modified into a third layer 700 by supplying a second reactant, which has a molecular structure different from that of the first reactant, to the wafer 200.

Specifically, the valve 243c is opened to allow the second reactant to flow into the gas supply pipe 232c. The flow rate of the second reactant is adjusted by the MFC 241c. The second reactant is supplied into the process chamber 201 via the nozzle 249c and is exhausted from the exhaust port 231a. At this time, the second reactant is supplied to the wafer 200. At this time, the valves 243e to 243g may be opened to supply the inert gas into the process chamber 201 via each of the nozzles 249a to 249c.

An example of a processing condition when supplying the second reactant in step D is described as follows.

Processing temperature: 400 to 800 degrees C., specifically 500 to 800 degrees C., more specifically 500 to 750 degrees C., even more specifically 600 to 750 degrees C.

Processing pressure: 1 to 4,000 Pa, specifically 600 to 1,000 Pa

Second reactant supply flow rate: 1 to 10 slm, specifically 3 to 7 slm

Second reactant supply time: 30 to 90 seconds, specifically 40 to 60 seconds

Other processing conditions may be the same as the processing conditions in step A.

It is desirable that the processing temperature in step D is the same as the processing temperature in step A, step B, and step C from the viewpoint of productivity of the film-forming process. However, the processing temperature in step D may be different from the processing temperature in step A, step B, and step C.

By supplying the second reactant to the wafer 200 under the above-mentioned processing condition, the second layer 500 can be modified into the third layer 700. That is, in step D, the second layer 500 can be modified into the third layer 700 having a composition different from that of the second layer 500. When modifying the second layer 500 into the third layer 700, an element different from the element contained in the second layer 500 can be added to the second layer 500 by the second reactant. Thus, as shown in FIG. 5D, it is possible to obtain the third layer 700 thicker than the second layer 500 shown in FIG. 5C.

Further, in step D, it is desirable to generate new adsorption sites (e.g., NH terminals) on the surface of the third layer 700 in the process of the modifying reaction (e.g., nitriding reaction) by the second reactant.

After modifying the second layer 500 into the third layer 700, the valve 243c is closed to stop the supply of the second reactant into the process chamber 201. Then, the second reactant, the gaseous substance, and the like remaining in the process chamber 201 are removed from the process chamber 201 by the same processing procedure and processing condition as in the above-described step A (purging).

—Second Reactant—

As the second reactant, a compound capable of modifying the second layer 500 into the third layer 700 may be used. From the viewpoint of the modifying effect of modifying the second layer 500 into the third layer 700, as the second reactant, it may be possible to use, for example, at least one selected from the group of a N- and H-containing gas, a C- and N-containing gas, a C- and H-containing gas, an O-containing gas, and a B-containing gas. As the second reactant, a compound having a molecular structure different from that of the first reactant is used.

As the N- and H-containing gas, the C- and N-containing gas, the C- and H-containing gas, the O-containing gas, and the B-containing gas used as the second reactant, it may be possible to use the same gas species as exemplified as the N- and H-containing gas, the C- and N-containing gas, the C- and H-containing gas, the O-containing gas, and the B-containing gas used as the first reactant. As the second reactant, one or more of these gas species may be used. An aspect of supply in a case where the second reactant is a mixed gas, and an aspect of supply in a case where the second reactant is a combination of two or more gases selected from different groups among five groups N- and H-containing gases, C- and N-containing gases, C- and H-containing gases, O-containing gases, and B-containing gases may be also the same as the aspect of supply of the first reactant.

—Combination of First and Second Reactants—

Examples of the combination of "first reactant"-"second reactant" or "second reactant"-"first reactant" in modification 1 are indicated below.

"N- and H-containing gas"-"C- and N-containing gas"
"N- and H-containing gas"-"C- and H-containing gas"
"N- and H-containing gas"-"O-containing gas"
"N- and H-containing gas"-"B-containing gas"
"C- and N-containing gas"-"C- and H-containing gas"
"C- and N-containing gas"-"O-containing gas"
"C- and N-containing gas"-"B-containing gas"
"C- and H-containing gas"-"O-containing gas"
"C- and H-containing gas"-"B-containing gas"
"O-containing gas"-"B-containing gas"

The combination of the first reactant and the second reactant determines the components of the third layer 700, that is, the components of the film 800, that is, the composition of the film 800. For example, when the first layer 400 is a Si-containing layer, in the above-mentioned combination, it may be possible to form, as the third layer 700, a Si-, C-, and N-containing layer, a Si-, O-, and N-containing layer, a Si-, B-, and N-containing layer, a Si-, O-, C-, and N-containing layer, a Si-, B-, C-, and N-containing layer, a Si-, O-, and C-containing layer, a Si-, B-, and C-containing layer, a Si-, B-, and O-containing layer, or the like. In these cases, as the film 800, a SiCN film, a SiON film, a SiBN film, a SiOCN film, a SiBCN film, a SiOC film, a SiBC film, a SiBO film, or the like may be formed.

Figure 5E:
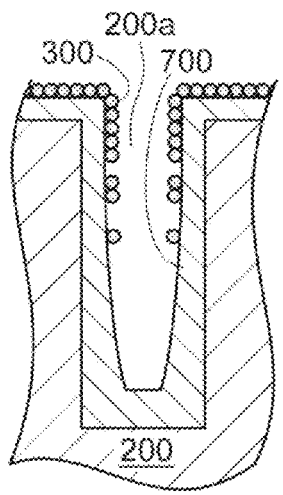
Figure 5F:
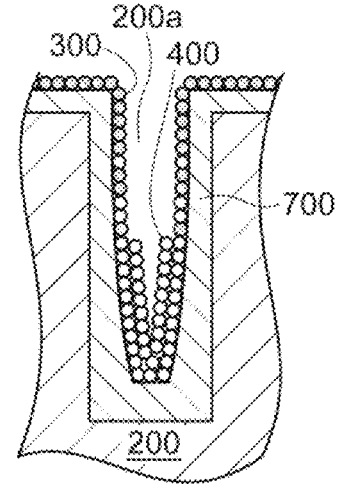

In modification 1, it is desirable that, as shown in FIGS. 5A to 5D, after performing a first cycle, which includes non-simultaneously performing step A, step B, step C, and step D, a second cycle, which includes non-simultaneously performing step A, step B, step C, and step D, is performed. Specifically, as shown in FIG. 5D, in step D, the third layer 700 is formed on the entire surface of the concave portion 200a of the wafer 200. Thereafter, when the second cycle is performed, steps A, B, C, and D are performed non-simultaneously in the named order on the wafer 200 in which the concave portion 200a having the third layer 700 is formed on the surface thereof. According to step A of the second cycle, from the state of FIG. 5D, as shown in FIG. 5E, the adsorption inhibitor is adsorbed on the adsorption sites of the upper portion of the concave portion 200a having the third layer 700 on the surface thereof (i.e., the adsorption sites of the surface of the third layer 700), whereby an adsorption inhibition layer 300 is formed again. Subsequently, in step B, as shown in FIG. 5F, the precursor is adsorbed on the adsorption sites existing in the concave portion 200a in which the adsorption inhibition layer 300 is formed again (i.e., the adsorption sites on the surface of the third layer 700), whereby a first layer 400 is formed again. Further, subsequently, in step C, as shown in FIG. 5G, the adsorption inhibition layer 300 and the first layer 400, which are formed again on the surface of the third layer 700, are modified into the second layer 500 by the first reactant. Then, in step D, as shown in FIG. 5H, the second layer 500, which is formed on the surface of the third layer 700, is modified into the third layer 700 by the second reactant. In such a second cycle, the third layer 700 is secondly formed on the first-formed third layer 700 in the concave portion 200a. By repeating the cycle a plurality of times, as shown in FIG. 5I, the entirety of the concave portion 200a is filled with the film 800 which is a stacked body of the third layer 700. By repeating, a plurality of times, the cycle which includes non-simultaneously performing step A, step B, step C, and step D, the same reaction as the reaction generated on the surface of the upper portion of the concave portion 200a is generated on the upper surface 200b of the wafer 200, whereby a film 800 is also formed on the upper surface 200b of the wafer 200.

Also in modification 1, the same effects as those of the above-described embodiments can be obtained. Further, by performing step D, the components contained in the second reactant, that is, the elements contained in at least one selected from the group of the N- and H-containing gas, the C- and N-containing gas, the C- and H-containing gas, the O-containing gas, and the B-containing gas can be added to the film 800 formed in the concave portion 200a, which makes it possible to modify the composition of the film.

Modification 2

Before step A, preprocessing for supplying a preprocessing gas to the wafer 200, the second layer 500, and the third layer 700 may be performed as in the processing sequences denoted below. By performing the preprocessing before step A, it is possible to increase the amount of adsorption sites on the outermost surface of the wafer 200 (in other words, increase the density of adsorption sites).

preprocessing→(adsorption inhibitor→precursor-
→first reactant)×n (preprocessing→adsorption inhibitor→precursor-
→first reactant)×n preprocessing→(adsorption inhibitor→precursor-
→first reactant→second reactant)×n (preprocessing→adsorption inhibitor→precursor-
→first reactant→second reactant)×n As the preprocessing gas, for example, a nitriding agent (nitriding gas) may be used. As the nitriding agent, a N- and H-containing gas may be used. As the N- and H-containing gas, the same gas species as those described above as the N- and H-containing gas used as the first reactant may be used.

An example of a processing condition when supplying the preprocessing gas will be described as follows.

Processing temperature: 400 to 800 degrees C., specifically 500 to 800 degrees C., more specifically 500 to 750 degrees C., even more specifically 600 to 750 degrees C.
    Processing pressure: 1 to 4,000 Pa, specifically 600 to 1,000 Pa
    Preprocessing gas supply flow rate: 1 to 10 slm, specifically 3 to 7 slm
    Preprocessing gas supply time: 30 to 300 seconds, specifically 60 to 180 seconds Other processing condition may be the same as the processing conditions in step A.

Also in modification 2, the same effects as those of the above-mentioned embodiments can be obtained. Further, according to modification 2, it is possible to increase an amount of adsorption sites on the outermost surface of the wafer 200 that was subjected to the pre-processing, that is, on the respective surfaces of the wafer 200, the second layer 500, and the third layer 700 (in other words, it is possible to increase the density of adsorption sites). As a result, in step A, the adsorption inhibitor is easily adsorbed and the density of the adsorption inhibition layer 300 can be increased. Further, in step B, the precursor is easily adsorbed and the density of the first layer 400 can be increased. As a result, it becomes possible to form a high-quality film at a higher deposition rate.

Modification 3

After step C or step D, post-processing may be performed on the wafer 200 as in the processing sequences denoted below. As the post-processing, for example, an annealing process may be performed.

(adsorption inhibitor→precursor→first reactant)× n→post-processing (adsorption inhibitor→precursor→first reactant-→post-processing)×n (adsorption inhibitor→precursor→first reactant→second reactant)×n→post-processing (adsorption inhibitor→precursor→first reactant→second reactant→post-processing)×n Specifically, after the film is formed in the concave portion 200a of the wafer 200, an annealing process is performed on the wafer 200 by adjusting an output of the heater 207 such that the temperature in the process chamber 201, that is, the temperature of the wafer 200 having the concave portion 200a filled with the film becomes equal to or higher than the temperature of the wafer 200 in steps A to C or steps A to D. From a viewpoint of an annealing effect, it is desirable that the processing temperature at the time of performing the annealing process is set to a temperature higher than the temperature of the wafer 200 in steps A to C or steps A to D. The annealing process may be performed in a state in which the post-processing gas is supplied into the process chamber 201. As the post-processing gas, for example, an inert gas such as an $N_2$ gas, an Ar gas, a He gas, or the like, a reactive gas such as a $H_2$ gas, an $NH_3$ gas, an $N_2H_4$ gas, a $H_2O$ gas, a $H_2O_2$ gas, an $O_2$ gas, an $O_3$ gas), or the like, and a mixed gas of these gases may be used.

An example of a processing condition in the post-processing is described as follows.

Processing temperature: 550 to 1,200 degrees C.
    Processing pressure: 1 to 101,325 Pa
    Post-processing gas supply flow rate: 0 to 10 slm
    Post-processing gas supply time: 1 to 240 minutes Other processing condition may be the same as the processing condition in step A.

Also in modification 3, the same effects as those of the above-described embodiments can be obtained. Further, according to modification 3, the annealing process is performed in a state in which the reactive gas, for example, a N- and H-containing gas such as an $NH_3$ gas, an $N_2H_4$ gas, or the like, a H- and O-containing gas such as a $H_2O$ gas, a $H_2O_2$ gas, or the like, or an O-containing gas such as an $O_2$ gas, an $O_3$ gas), or the like is supplied into the process chamber 201, whereby the film formed in the concave portion 200a can be expanded. As a result, even if seams or voids are generated in the film formed in the concave portion 200a of the wafer 200 due to a certain factor, they can be eliminated by this annealing process. That is, according to modification 3, it is possible to complement the film formed in the concave portion 200a of the wafer 200, and perform void-free and seamless filling for the concave portion 200a of the wafer 200.

Other Embodiments of the Present Disclosure

The embodiments of the present disclosure have been specifically described above. However, the present disclosure is not limited to the above-described embodiments, and various changes may be made without departing from the gist thereof.

In the above-described embodiments, although the example in which the adsorption sites on the surface of the wafer 200 are, for example, NH terminals has been mainly described, the adsorption sites on the surface of the wafer 200 may be, for example, OH terminals. When the above-mentioned processing sequence is performed on a wafer 200 having OH terminals as adsorption sites on the surface thereof, it may be possible to use an adsorption inhibitor or a precursor capable of being adsorbed on the OH terminals. As the first reactant and the second reactant, it may be possible to use various gases exemplified in the above-described embodiments. However, as the first reactant and the second reactant, it is desirable to use gas species capable of forming OH terminals. For example, an O- and H-containing gas may be used. Further, in this case, when the preprocessing is performed, an oxidizing agent may be used as the preprocessing gas. An O- and H-containing gas may be used as the oxidizing agent. As the O- and H-containing gas, for example, a $H_2O$ gas, a $H_2O_2$ gas, or the like may be used. Further, as the O- and H-containing gas, it may also be possible to use an O-containing gas and an H-containing gas such as $O_2$ gas+$H_2$ gas or the like. Even when the adsorption sites on the surface of the wafer 200 are OH terminals, the same effects as described above can be obtained. However, it is desirable that the adsorption sites on the surface of the wafer 200 are NH terminals from the viewpoint of the efficiency of the adsorption reaction of the adsorption inhibitor and the precursor.

In the above-described embodiments, there has been described the example in which the execution period of step A and the execution period of step B do not overlap, for example, the example in which the supply of the adsorption inhibitor is stopped in step A and then step B is started. However, the present disclosure is not limited thereto. For example, the execution period of step A and the execution period of step B may be at least partially overlapped in such a way that step B is started to supply the precursor while continuously supplying the adsorption inhibitor. By doing so, in addition to the effects of the above-described embodiment, it is possible to shorten the cycle time and improve the throughput of the substrate processing.

In the above-described embodiment, there has been described the example in which the film 600 is formed so as to fill the inside of the concave portion 200a. However, the present disclosure is not limited thereto. For example, a film 600 such as a liner film or the like may be formed along the surface of the concave portion 200a without embedding the concave portion 200a. Further, in the above-mentioned modification 1, there has been described the example in which the film 800 is formed so as to fill the inside of the concave portion 200a. However, the present disclosure is not limited thereto. For example, a film 800 such as a liner film or the like may be formed along the surface of the concave portion 200a without embedding the concave portion 200a. In these cases, the number of cycles may be controlled to stop the film-forming process before the inside of the concave portion 200a is filled. In these cases as well, the same effects as those described above can be obtained. Further, in these cases, the step coverage can be significantly improved, and a conformal film can be formed. In particular, a pattern having a large aspect ratio in the concave portion tends to deteriorate the step coverage. However, according to the present embodiments, a film having high step coverage can be formed even for a pattern having a large aspect ratio in the concave portion.

It is desirable that the recipe used for each process are prepared separately according to the processing contents and are stored in the memory device 121c via an electric communication line or an external memory device 123. When starting each process, it is preferable that the CPU 121a properly selects an appropriate recipe from a plurality of recipes stored in the memory device 121c according to the contents of the process. This makes it possible to form films of various film types, composition ratios, film qualities and film thicknesses with high reproducibility in one substrate processing apparatus. In addition, the burden on an operator can be reduced, and each process can be quickly started while avoiding operation errors.

The above-described recipes are not limited to the newly prepared ones, but may be prepared by, for example, changing the existing recipes already installed in the substrate processing apparatus. In the case of changing the recipes, the recipes after the change may be installed in the substrate processing apparatus via an electric communication line or a recording medium in which the recipes are recorded. In addition, the input/output device 122 provided in the existing substrate processing apparatus may be operated to directly change the existing recipes already installed in the substrate processing apparatus.

In the above-described embodiment, there has been described an example in which a film is formed using a batch type substrate processing apparatus for processing a plurality of substrates at a time. The present disclosure is not limited to the above-described embodiment, but may be suitably applied to, for example, a case where a film is formed using a single-wafer type substrate processing apparatus for processing one or several substrates at a time. Furthermore, in the above-described embodiment, there has been described an example in which a film is formed using a substrate processing apparatus having a hot wall type process furnace. The present disclosure is not limited to the above-described embodiment but may also be suitably applied to a case where a film is formed using a substrate processing apparatus having a cold wall type process furnace.

Even when these substrate processing apparatuses are used, each processing can be performed under the same processing procedure and processing conditions as those of the above-described embodiment and modifications, and the same effects as those of the above-described embodiment and modifications can be obtained.

The above-described embodiments and modifications may be used in combination as appropriate. The processing procedure and processing conditions at this time may be, for example, the same as the processing procedures and processing conditions of the above-described embodiment and modifications.

EXAMPLES

Example 1

Using the substrate processing apparatus shown in FIG. 1, a cycle which includes non-simultaneously performing steps A, B, and C on a wafer having a concave portion on the surface thereof was repeated a plurality of times to form a SiN film in the concave portion on the surface of the wafer, thereby preparing a first evaluation sample. When preparing the first evaluation sample, a wafer with a concave portion (trench) having a depth of 3 μm, a width of 100 nm and an aspect ratio of 30 as shown in FIG. 6 was used, a $SiCl_4$ gas was used as an adsorption inhibitor, a $Si_2Cl_6$ gas was used as a precursor, and an $NH_3$ gas was used as a first reactant. The processing condition in each step when preparing the first evaluation sample were set to a predetermined condition within the processing condition range in each step of the processing sequence of the above-described embodiments.

Comparative Example 1

A SiN film was formed in the concave portion on the surface of the wafer in the same manner as in Example 1 except that step A is not performed, thereby preparing a second evaluation sample. The wafer, precursor, first reactant and processing condition in each step in the preparation of the second evaluation sample were the same as those in the preparation of the first evaluation sample.

Step coverage (also referred to as S/C) was measured for each of the obtained evaluation samples. In this regard, the step coverage was obtained by substituting the thickness $T_{TOP}$ of the SiN film formed at the upper portion (edge) of the concave portion and the thickness $T_{BOT}$ of the SiN film formed at the lower portion of the concave portion, which are measured from the images (SEM images) of the evaluation samples as shown in FIG. 6, into the following formula X.

$$S/C\ (\%)=[T_{BOT}/T_{TOP}]\times 100 \qquad \text{Formula X:}$$

The results are shown in FIG. 6. In Comparative Example 1 (second evaluation sample), the step coverage (S/C) is 99%, whereas in Example 1 (first evaluation sample), the step coverage (S/C) is 107%. Thus, it can be seen that the step coverage in Example 1 (first evaluation sample) is higher than the step coverage in Comparative Example 1 (second evaluation sample). As a result, according to Example 1, it was confirmed that the thickness of the second layer formed by modifying the first layer can be made larger than the thickness of the second layer formed by modifying the adsorption inhibition layer, and the thickness of the film formed at the lower portion of the concave portion can be made larger than the thickness of the film formed at the upper portion of the concave portion.

According to the present disclosure in some embodiments, it is possible to form a high-quality film in a concave portion provided on a surface of a substrate at a high deposition rate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   forming a film in a concave portion provided on a surface of the substrate by performing a cycle a predetermined number of times, the cycle including:
   (a) forming an adsorption inhibition layer by supplying an adsorption inhibitor, which inhibits adsorption of a precursor, to the substrate and adsorbing the adsorption inhibitor on adsorption sites of an upper portion in the concave portion;
   (b) forming a first layer by supplying the precursor to the substrate and adsorbing the precursor on adsorption sites existing in the concave portion in which the adsorption inhibition layer is formed; and
   (c) modifying the adsorption inhibition layer and the first layer into a second layer by supplying a first reactant, which chemically reacts with both the adsorption inhibition layer and the first layer, to the substrate,
   wherein both the adsorption inhibitor and the precursor contain a main element constituting the film and a halogen element.

2. The method of claim 1, wherein a thickness of the first layer is made thicker than a thickness of the adsorption inhibition layer.

3. The method of claim 1, wherein a thickness of the second layer formed by modifying the first layer is made thicker than a thickness of the second layer formed by modifying the adsorption inhibition layer.

4. The method of claim 1, wherein the second layer formed by modifying the first layer and the second layer formed by modifying the adsorption inhibition layer have the same components.

5. The method of claim 1, wherein both the adsorption inhibitor and the precursor contain at least one selected from the group of chlorine, fluorine, bromine, and iodine.

6. The method of claim 1, wherein each of the adsorption inhibitor and the precursor is halosilane.

7. The method of claim 1, wherein each of the adsorption inhibitor and the precursor is chlorosilane.

8. The method of claim 1, wherein a thermal decomposition temperature of the adsorption inhibitor is higher than a thermal decomposition temperature of the precursor.

9. The method of claim 1, wherein a decomposition rate of the adsorption inhibitor in (a) is made lower than a decomposition rate of the precursor in (b).

10. The method of claim 1, wherein a ratio of a surface reaction to a gas phase reaction in (a) is made higher than a ratio of a surface reaction to a gas phase reaction in (b).

11. The method of claim 1, wherein a supply time of the adsorption inhibitor is made equal to or less than a supply time of the precursor.

12. The method of claim 1, wherein a supply time of the adsorption inhibitor is made equal to or less than a supply time of the precursor, and the supply time of the precursor is made less than a supply time of the first reactant.

13. The method of claim 1, wherein the adsorption inhibition layer contains a partial structure in which three halogens are bonded to an atom of the main element.

14. The method of claim 1, wherein the adsorption inhibitor is a compound represented by $SiX_3R$ (where each of the three Xs independently denotes Cl, F, Br, or I and R denotes Cl, F, Br, I, an alkyl group, or an amino group).

15. The method of claim 1, wherein the first reactant is at least one selected from the group of a nitrogen- and hydrogen-containing gas, a carbon- and nitrogen-containing gas, a carbon- and hydrogen-containing gas, an oxygen-containing gas, and a boron-containing gas.

16. The method of claim 1, wherein the cycle further includes performing (d) modifying the second layer into a third layer by supplying a second reactant, which is different from the first reactant in a molecular structure, to the substrate, non-simultaneously with each of (a), (b), and (c).

17. The method of claim 16, wherein each of the first reactant and the second reactant is at least one selected from the group of a nitrogen- and hydrogen-containing gas, a carbon- and nitrogen-containing gas, a carbon- and hydrogen-containing gas, an oxygen-containing gas, and a boron-containing gas.

18. A method of manufacturing a semiconductor device, comprising:
   forming a film in a concave portion provided on a surface of a substrate by performing a cycle a predetermined number of times, the cycle including:
   (a) forming an adsorption inhibition layer by supplying an adsorption inhibitor, which inhibits adsorption of a precursor, to the substrate and adsorbing the adsorption inhibitor on adsorption sites of an upper portion in the concave portion;
   (b) forming a first layer by supplying the precursor to the substrate and adsorbing the precursor on adsorption sites existing in the concave portion in which the adsorption inhibition layer is formed; and
   (c) modifying the adsorption inhibition layer and the first layer into a second layer by supplying a first reactant, which chemically reacts with both the adsorption inhibition layer and the first layer, to the substrate,
   wherein both the adsorption inhibitor and the precursor contain a main element constituting the film and a halogen element.

19. A substrate processing apparatus, comprising:
   a precursor supply system configured to supply a precursor to a substrate;
   an adsorption inhibitor supply system configured to supply an adsorption inhibitor to the substrate;
   a first reactant supply system configured to supply a first reactant to the substrate; and
   a controller configured to be capable of controlling the precursor supply system, the adsorption inhibitor supply system, and the first reactant supply system so as to perform:
   forming a film in a concave portion provided on a surface of the substrate by performing a cycle a predetermined number of times, the cycle including:
   (a) forming an adsorption inhibition layer by supplying the adsorption inhibitor, which inhibits adsorption of the precursor, to the substrate and adsorbing the adsorption inhibitor on adsorption sites of an upper portion in the concave portion;

(b) forming a first layer by supplying the precursor to the substrate and adsorbing the precursor on adsorption sites existing in the concave portion in which the adsorption inhibition layer is formed; and (c) modifying the adsorption inhibition layer and the first layer into a second layer by supplying the first reactant, which chemically reacts with both the adsorption inhibition layer and the first layer, to the substrate, wherein both the adsorption inhibitor and the precursor contain a main element constituting the film and a halogen element.

20. A non-transitory computer-readable recording medium storing a program that causes, by a computer, a substrate processing apparatus to perform:

forming a film in a concave portion provided on a surface of a substrate by performing a cycle a predetermined number of times, the cycle including:

(a) forming an adsorption inhibition layer by supplying an adsorption inhibitor, which inhibits adsorption of a precursor, to the substrate and adsorbing the adsorption inhibitor on adsorption sites of an upper portion in the concave portion;

(b) forming a first layer by supplying the precursor to the substrate and adsorbing the precursor on adsorption sites existing in the concave portion in which the adsorption inhibition layer is formed; and (c) modifying the adsorption inhibition layer and the first layer into a second layer by supplying a first reactant, which chemically reacts with both the adsorption inhibition layer and the first layer, to the substrate, wherein both the adsorption inhibitor and the precursor contain a main element constituting the film and a halogen element.

* * * * *